(12) United States Patent
Onishi

(10) Patent No.: US 10,066,926 B2
(45) Date of Patent: Sep. 4, 2018

(54) COMPONENT MOUNTING APPARATUS

(71) Applicant: YAMAHA HATSUDOKI KABUSHIKI KAISHA, Shizuoka-ken (JP)

(72) Inventor: Tadashi Onishi, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 338 days.

(21) Appl. No.: 14/045,706

(22) Filed: Oct. 3, 2013

(65) Prior Publication Data

US 2014/0300730 A1 Oct. 9, 2014

(30) Foreign Application Priority Data

Apr. 4, 2013 (JP) .................................. 2013-078187

(51) Int. Cl.
  *G01B 11/14* (2006.01)
  *H04N 7/18* (2006.01)
  *H05K 13/08* (2006.01)

(52) U.S. Cl.
  CPC .............. *G01B 11/14* (2013.01); *H04N 7/18* (2013.01); *H05K 13/08* (2013.01)

(58) Field of Classification Search
  CPC ......... H05K 13/0015; H05K 2203/166; H05K 13/08; H04N 7/18
  See application file for complete search history.

(56) References Cited

U.S. PATENT DOCUMENTS 5,084,962 A * 2/1992 Takahashi .............. H05K 13/08
                                                      221/289
5,237,622 A * 8/1993 Howell .................. H05K 13/08
                                                      348/87
5,311,304 A * 5/1994 Monno .............. H05K 13/0053
                                                      29/833

(Continued)

FOREIGN PATENT DOCUMENTS

CN      1285035 A     2/2001
CN      1738516 A     2/2006

(Continued)

OTHER PUBLICATIONS

An Office Action; "Notice of Reasons for Rejection," issued by the Japanese Patent Office dated Nov. 8, 2016, which corresponds to Japanese Patent Application No. 2013-078187 and is related to U.S. Appl. No. 14/045,706.

(Continued)

*Primary Examiner* — Marnie A Matt
(74) *Attorney, Agent, or Firm* — Studebaker & Brackett PC

(57) ABSTRACT

This component mounting apparatus includes a head portion capable of mounting a component suctioned by a nozzle on a board, a board imaging portion provided on the head portion to be movable relative to the head portion so as to image the board, and an imaging position correction mark provided in the head portion to be capable of being imaged by the board imaging portion and is configured to correct the displacement of the board imaging portion relative to the head portion on the basis of an image of the imaging position correction mark imaged by the board imaging portion.

20 Claims, 7 Drawing Sheets

(56) References Cited

U.S. PATENT DOCUMENTS

| | | | | |
|---|---|---|---|---|
| 5,903,662 | A | * | 5/1999 | DeCarlo ............ H05K 13/0413 382/145 |
| 5,930,140 | A | * | 7/1999 | Asai ................. H05K 13/02 29/783 |
| 6,073,342 | A | * | 6/2000 | Asai ................. H05K 13/0061 198/586 |
| 6,101,709 | A | * | 8/2000 | Shiota ............... H05K 13/0413 29/740 |
| 6,195,454 | B1 | * | 2/2001 | Yazawa ............. H05K 13/0413 348/125 |
| 6,211,942 | B1 | * | 4/2001 | Okamoto ............. G03F 7/203 355/26 |
| 6,538,244 | B1 | * | 3/2003 | Skunes ............... G01B 11/024 250/208.1 |
| 6,718,057 | B1 | * | 4/2004 | Mori ................. G06T 7/73 250/491.1 |
| 2002/0031279 | A1 | * | 3/2002 | Shimizu ............ H05K 13/0413 382/291 |
| 2004/0188642 | A1 | * | 9/2004 | Kodama ............ H05K 13/0413 250/559.29 |
| 2005/0117797 | A1 | * | 6/2005 | Gaida ................ H05K 13/08 382/153 |
| 2006/0048380 | A1 | * | 3/2006 | Okuda ................ H05K 13/08 29/832 |
| 2006/0048383 | A1 | * | 3/2006 | Nishiwaki ........... H05K 3/0008 29/833 |
| 2008/0250636 | A1 | * | 10/2008 | Okuda ................ H05K 13/08 29/834 |
| 2009/0288292 | A1 | * | 11/2009 | Kagaya .............. H05K 13/0413 29/739 |
| 2010/0097461 | A1 | * | 4/2010 | Utsumi .............. H05K 13/0413 348/143 |
| 2011/0089968 | A1 | * | 4/2011 | Kogure .............. G01R 31/2893 324/757.04 |
| 2014/0130348 | A1 | * | 5/2014 | Okuda .............. H05K 13/0413 29/833 |

FOREIGN PATENT DOCUMENTS

| | | | |
|---|---|---|---|
| CN | 101587829 | A | 11/2009 |
| JP | 2001-251098 | A | 9/2001 |
| JP | 2007-294727 | A | 11/2007 |
| JP | 2008-085322 | A | 4/2008 |
| JP | 2008-270649 | A | 11/2008 |
| JP | 2009-010307 | A | 1/2009 |
| JP | 2009-140945 | A | 6/2009 |
| JP | 2009-212251 | A | 9/2009 |
| JP | 2009212251 | A * | 9/2009 |

OTHER PUBLICATIONS

An Office Action issued by the Chinese Patent Office dated Jul. 5, 2016, which corresponds to Chinese Patent Application No. 201310704288.6 and is related to U.S. Appl. No. 14/045,706; with English language translation.

The Second Office Action issued by the Chinese Patent Office dated Feb. 27, 2017, which corresponds to Chinese Patent Application No. 201310704288.6 and is related to U.S. Appl. No. 14/045,706; with English language translation.

The extended European search report issued by the European Patent Office dated Jan. 30, 2015, which corresponds to European Patent Application No. 13004623.8-1803 and is related to U.S. Appl. No. 14/045,706.

* cited by examiner

COMPONENT MOUNTING APPARATUS (FIRST EMBODIMENT)

COMPONENT MOUNTING APPARATUS (FIRST EMBODIMENT)

POSITION A, POSITION B:
PROPER BOARD RECOGNITION POSITION

*FIG.5* (FIRST EMBODIMENT)
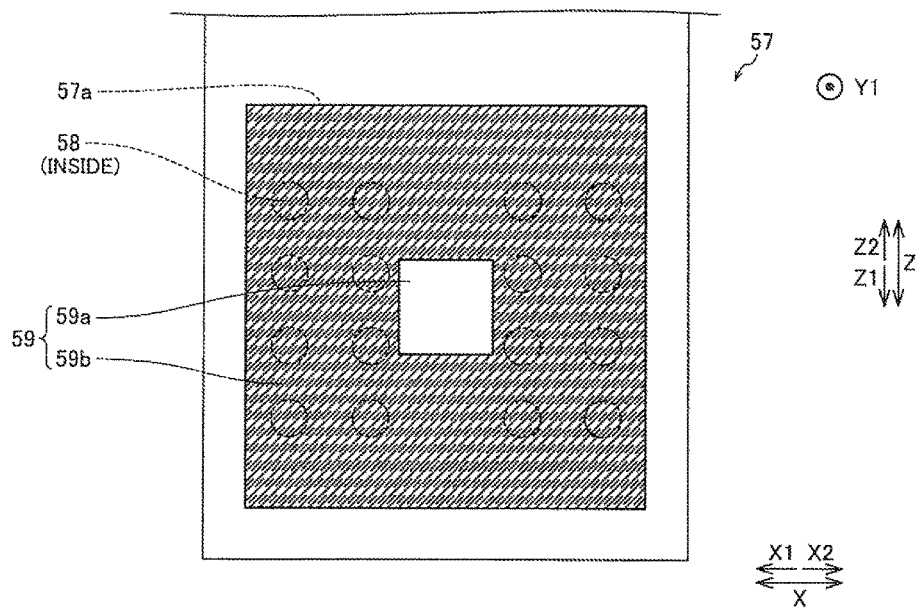
*FIG.6*
CAPTURED IMAGE OF CORRECTION MARK MEMBER (FIRST EMBODIMENT)
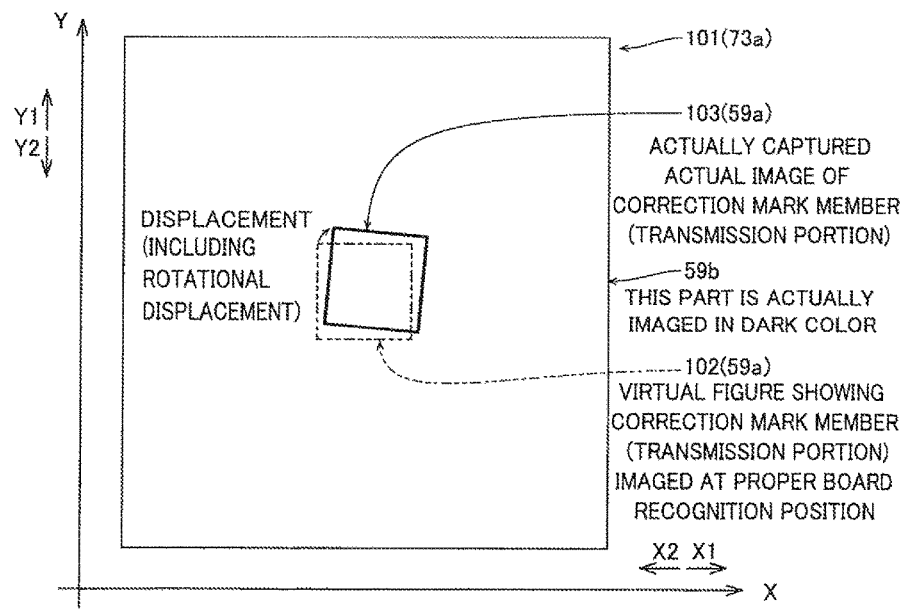

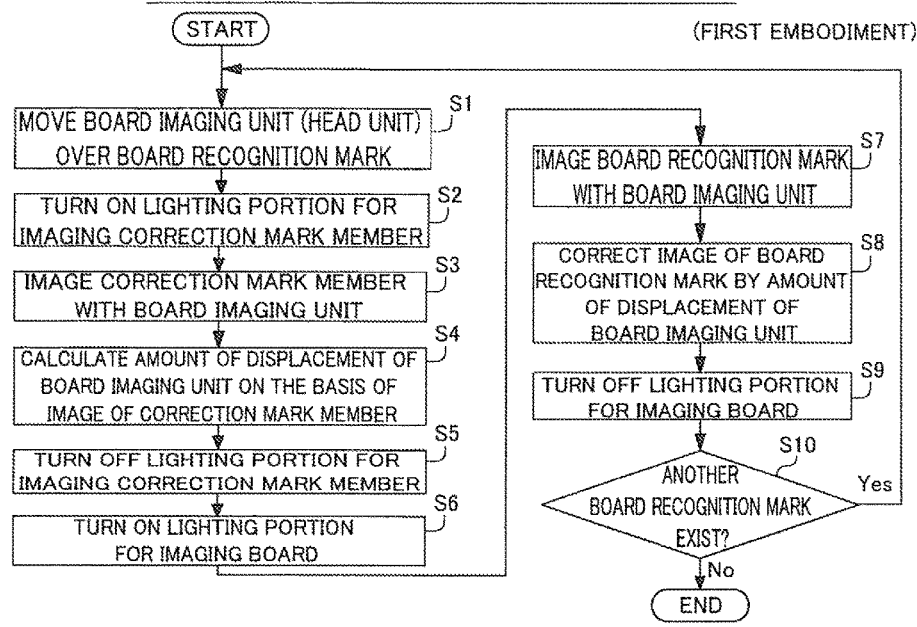
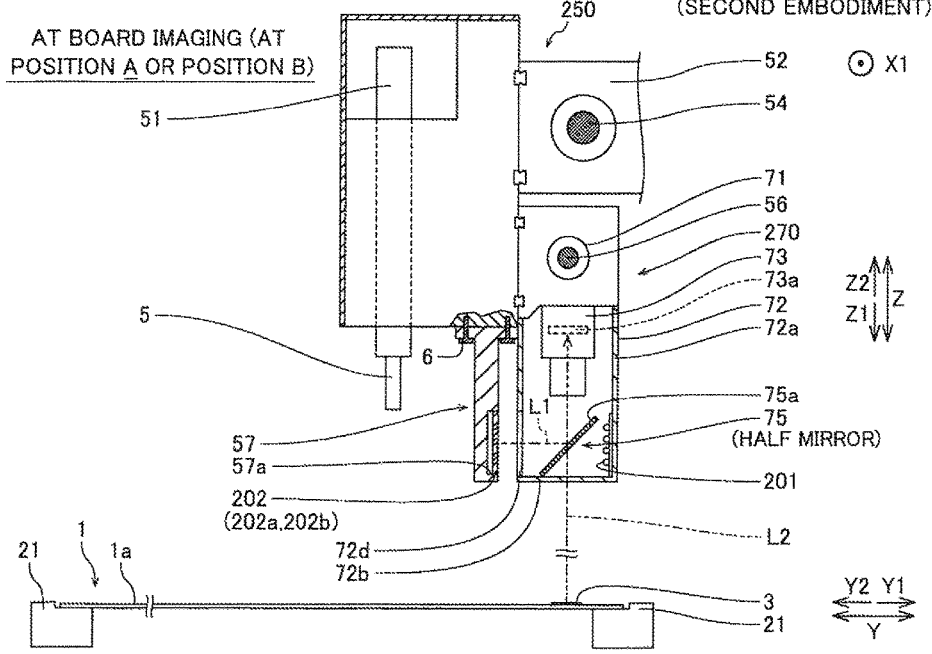

CAPTURED IMAGE OF CORRECTION MARK MEMBER AND BOARD

COMPONENT MOUNTING APPARATUS

CROSS-REFERENCE TO RELATED APPLICATION

The priority application number JP2013-078187, Component Mounting Apparatus, Apr. 4, 2013, Tadashi Onishi, upon which this patent application is based is hereby incorporated by reference.

BACKGROUND OF THE INVENTION

Field of the Invention

The present invention relates to a component mounting apparatus, and more particularly, it relates to a component mounting apparatus including a head portion configured to mount a component on a board and a board imaging portion provided on the head portion to image the board.

Description of the Background Art

A component mounting apparatus including a head portion configured to mount a component on a board and a board imaging portion provided on the head portion to image the board is known in general. Such a component mounting apparatus is disclosed in Japanese Patent Laying-Open No. 2008-270649, for example.

Japanese Patent Laying-open No. 2008-270649 discloses a surface mounter (a component mounting apparatus) including a head portion configured to mount a component suctioned through a nozzle on a board and a board recognition camera (a board imaging portion) fixedly provided on the head portion to image the board. This surface mounter is configured to move the board recognition camera fixed to the head portion over the board by movement of the head portion, image a board recognition mark applied to the board with the board recognition camera, and grasp (recognize) the conveyance position, angle, and expansion/contraction state of the board on the basis of an image of the board recognition mark.

In the conventional surface mounter described in Japanese Patent Laying-open No. 2008-270649, the board recognition camera is conceivably moved relative to the head portion to a position for imaging the board recognition mark in the head portion when the board recognition camera images the board recognition mark in the case where the board recognition camera is provided on the head portion to be movable relative to the head portion. However, in this case, the position of the board recognition camera on control estimated by an encoder (a position detection sensor) of a drive shaft may be displaced from the actual position of the actually moved board recognition camera due to inertial force at the time of rotation of the drive shaft for moving the board recognition camera, shaft elongation following heat generation of the drive shaft, etc. Therefore, when the board recognition camera images the board recognition mark in a state displaced from a proper position for imaging the board recognition mark, it is difficult to grasp the accurate conveyance position of the board on the basis of the image of the board recognition mark. Consequently, the board cannot be accurately recognized.

SUMMARY OF THE INVENTION

The present invention has been proposed in order to solve the aforementioned problem, and an object of the present invention is to provide a component mounting apparatus capable of accurately recognizing a board even in the case where a board imaging portion is provided on a head portion to be movable relative to the head portion so as to recognize the board.

In order to attain the aforementioned object, a component mounting apparatus according to an aspect of the present invention includes a head portion capable of mounting a component suctioned by a nozzle on a board, a board imaging portion provided on the head portion to be movable relative to the head portion so as to image the board, and an imaging position correction mark provided in the head portion to be capable of being imaged by the board imaging portion and is configured to correct the displacement of the board imaging portion relative to the head portion on the basis of an image of the imaging position correction mark imaged by the board imaging portion.

As hereinabove described, the component mounting apparatus according to the aspect of the present invention includes the component mounting apparatus 100 includes the board imaging portion provided on the head portion to be movable relative to the head portion and the imaging position correction mark provided in the head portion to be capable of being imaged by the board imaging portion and is configured to correct the displacement of the board imaging portion relative to the head portion on the basis of the image of the imaging position correction mark imaged by the board imaging portion, whereby the displacement of the board imaging portion relative to the head portion grasped on the basis of the image of the imaging position correction mark imaged by the board imaging portion can be reflected also in an image of the board when the board imaging portion is moved relative to the head portion and images the board at a prescribed position for imaging the board. In other words, the image of the board in which the displacement of the board imaging portion relative to the head portion has been corrected (reflected) can be obtained, and hence the exact position of the board can be grasped and the board can be accurately recognized even in the case where the board imaging portion is provided on the head portion to be movable relative to the head portion so as to recognize the board.

In the aforementioned component mounting apparatus according to the aspect, the board imaging portion is preferably configured to be movable to a board recognition position where the board can be imaged in the head portion, and the component mounting apparatus is preferably configured to correct the displacement of the board imaging portion from the board recognition position in the head portion on the basis of the image of the imaging position correction mark imaged by the board imaging portion. According to this structure, the displacement of the board imaging portion from the board recognition position in the head portion grasped on the basis of the image of the imaging position correction mark imaged by the board imaging portion can be reflected in the image of the board when the board imaging portion is moved relative to the head portion and images the board at the board recognition position.

In the aforementioned component mounting apparatus according to the aspect, the image of the imaging position correction mark imaged by the board imaging portion preferably includes displacement information grasped in the case where the board imaging portion images the imaging position correction mark with a displacement relative to the head portion, based on the case where the board imaging portion images the imaging position correction mark without the displacement relative to the head portion, and the component mounting apparatus is preferably configured to acquire an image of the board in which the displacement of the board imaging portion relative to the head portion has been corrected by reflecting the displacement of the board imaging portion relative to the head portion based on the displacement information in image data of the board imaged by the board imaging portion. According to this structure, effectively using the displacement information grasped on the basis of the image of the imaging position correction mark in the case where the board imaging portion is actually displaced from a design reference position where the board imaging portion is not displaced, correction data of the displacement of the board imaging portion relative to the head portion can be properly reflected in the image data of the board imaged by the displaced board imaging portion, and the image (the corrected image data) of the board can be easily acquired.

In the aforementioned component mounting apparatus according to the aspect, the board imaging portion is preferably configured to be movable relative to the head portion along a direction substantially parallel to a mounting surface of the board on which the component is mounted, and the component mounting apparatus is preferably configured to correct the displacement of the board imaging portion relative to the head portion in the direction substantially parallel to the mounting surface of the board on the basis of the image of the imaging position correction mark imaged by the board imaging portion. According to this structure, the position of the board imaging portion in the plane of the mounting surface of the board can be grasped with a high degree of accuracy even in the case where the board imaging portion is configured to be moved relative to the head portion in the in-plane direction of the mounting surface of the board so as to recognize the board.

In the aforementioned component mounting apparatus according to the aspect, the board imaging portion is preferably configured to be movable relative to the head portion along a direction substantially perpendicular to the mounting surface of the board on which the component is mounted, and the component mounting apparatus is preferably configured to correct the displacement of the board imaging portion relative to the head portion in the direction substantially perpendicular to the mounting surface of the board on the basis of the image of the imaging position correction mark imaged by the board imaging portion. According to this structure, even in the case where the board imaging portion is configured to be moved relative to the head portion in the direction substantially perpendicular to the mounting surface of the board so as to recognize the board, in the image of the board, the displacement of the board imaging portion in vertical movement with respect to the head portion is corrected, and hence the accuracy of recognition of the board in the board imaging portion can be further improved. Particularly when the board imaging portion having a fixed focal length is employed, the present invention is very useful since the image of the board in which a deviation in the focal length of the board imaging portion to the board has been corrected can be obtained.

In the aforementioned component mounting apparatus according to the aspect, the imaging position correction mark is preferably provided at a board recognition position where the board imaging portion can image the board in the head portion, and the component mounting apparatus is preferably configured to correct the displacement of the board imaging portion from the board recognition position in the head portion on the basis of the image of the imaging position correction mark imaged by the board imaging portion when the board imaging portion is moved relative to the head portion to the board recognition position. According to this structure, the displacement of the board imaging portion from the board recognition position can be easily grasped by imaging the imaging position correction mark provided at the board recognition position for imaging the board, unlike the case where the imaging position correction mark is provided at a position different from the board recognition position of the head portion. Therefore, the board imaging portion can easily image the board in a state where the displacement of the board imaging portion from the board recognition position in the head portion is grasped on the basis of the image of the imaging position correction mark.

In the aforementioned component mounting apparatus according to the aspect, the board imaging portion preferably includes an optical member capable of reflecting and transmitting light and the imaging position correction mark is preferably provided at the board recognition position where the board imaging portion can image the board in the head portion, and the component mounting apparatus is preferably configured to correct the displacement of the board imaging portion from the board recognition position on the basis of an image of the imaging position correction mark imaged in a viewing region of the board imaging portion through a first optical path formed by the optical member and image the board in the viewing region of the board imaging portion through a second optical path formed by the optical member, when the board imaging portion is moved relative to the head portion to the board recognition position. According to this structure, the displacement of the board imaging portion from the board recognition position can be corrected by imaging the imaging position correction mark in the single viewing region of the board imaging portion through the first optical path with the optical member, and the board can be imaged in this viewing region by switching from the first optical path to the second optical path. Thus, effectively using the viewing region of the board imaging portion, the displacement of the board imaging portion from the board recognition position can be corrected, and the board can be easily imaged.

In the aforementioned component mounting apparatus according to the aspect, the board imaging portion preferably includes the optical member capable of reflecting and transmitting light, the viewing region of the board imaging portion preferably includes a first region where the imaging position correction mark is imaged and a second region where the board is imaged, provided in a region different from the first region, and the imaging position correction mark is preferably provided at the board recognition position where the board imaging portion can image the board in the head portion, and the component mounting apparatus is preferably configured to correct the displacement of the board imaging portion from the board recognition position on the basis of an image of the imaging position correction mark imaged in the first region of the board imaging portion through the first optical path formed by the optical member and image the board in the second region of the board imaging portion through the second optical path formed by the optical member, when the board imaging portion is moved relative to the head portion to the board recognition position. According to this structure, effectively using the single viewing region of the board imaging portion, the board imaging portion can image the imaging position correction mark in the first region of the viewing region and image the board in the second region of the viewing region at once. Thus, a board recognition operation including an operation of correcting the displacement of the board imaging portion relative to the head portion can be performed more quickly.

The aforementioned component mounting apparatus according to the aspect is preferably configured to correct the displacement of the board imaging portion relative to the head portion on the basis of the image of the imaging position correction mark imaged by the board imaging portion when the board imaging portion is moved relative to the head portion to the vicinity of an end of the head portion. According to this structure, the displacement of the board imaging portion relative to the head portion can be corrected by simply moving the board imaging portion to the vicinity of the end of the head portion. Therefore, the board imaging portion can accurately recognize the board in a state where the board imaging portion is moved to the vicinity of the end of the head portion.

In the aforementioned structure of correcting the displacement of the board imaging portion when the board imaging portion is moved relative to the head portion to the vicinity of the end of the head portion, the board imaging portion is preferably configured to be movable to the board recognition position where the board can be imaged in the head portion and the board recognition position is preferably provided in the vicinity of the end of the head portion, and the component mounting apparatus is preferably configured to correct the displacement of the board imaging portion from the board recognition position in the head portion on the basis of the image of the imaging position correction mark imaged by the board imaging portion when the board imaging portion is moved relative to the head portion to the vicinity of the end. According to this structure, the displacement of the board imaging portion based on the image of the imaging position correction mark can be easily grasped at the board recognition position provided in the vicinity of the end of the head portion not directly influenced by the arrangement of the nozzle when the board imaging portion is moved to the vicinity of the end of the head portion.

In the aforementioned structure in which the board imaging portion is movable relative to the head portion along the direction substantially parallel to the mounting surface of the board, the component mounting apparatus is preferably configured to acquire an image of the board in which the displacement has been corrected by reflecting the displacement of the board imaging portion relative to the head portion in the direction substantially parallel to the mounting surface of the board in the image data of the board imaged by the board imaging portion. According to this structure, when the board imaging portion is configured to be moved relative to the head portion in the in-plane direction of the mounting surface of the board so as to recognize the board, the correction data of the displacement of the board imaging portion relative to the head portion in the direction substantially parallel to the mounting surface can be properly reflected in the captured image data of the board, and the image (the corrected captured image data) of the board can be easily acquired.

In the aforementioned structure in which the board imaging portion is movable relative to the head portion along the direction substantially parallel to the mounting surface of the board, the imaging position correction mark preferably includes a figure having corners, and the component mounting apparatus is preferably configured to correct the displacement of the board imaging portion relative to the head portion in the direction substantially parallel to the mounting surface of the board on the basis of an image of the figure having corners imaged by the board imaging portion. According to this structure, the amount of displacement of the board imaging portion including rotational components relative to the head portion in the plane of the mounting surface can be easily and accurately acquired on the basis of image processing of the captured image of the figure having corners, constituting the imaging position correction mark.

In the aforementioned structure in which the board imaging portion includes the optical member, the imaging position correction mark is preferably so provided in the head portion that the length of the first optical path used to image the imaging position correction mark with the board imaging portion becomes substantially equal to the length of the second optical path used to image the board with the board imaging portion. According to this structure, the focal length of the board imaging portion in the case of imaging the imaging position correction mark through the first optical path can be rendered substantially equal to the focal length of the board imaging portion in the case of imaging the board through the second optical path, and hence even the board imaging portion whose focal length is set as a fixed value can accurately recognize the board.

In the aforementioned structure in which the board imaging portion includes the optical member, the first optical path preferably includes an optical path formed to capture an image of the imaging position correction mark reflected by the optical member with the board imaging portion, and the second optical path preferably includes an optical path formed to capture an image of the board transmitted through the optical member with the board imaging portion. According to this structure, in the structure of the board imaging portion directly imaging the board through the second optical path transmitted through the optical member, the displacement of the board imaging portion with respect to the head portion can be easily grasped using the first optical path for capturing the image of the imaging position correction mark reflected by the optical member with the board imaging portion prior to imaging of the board. In addition, the board can be recognized by imaging the board through the second optical path without changing the optical axis of the board imaging portion with respect to the board.

In the aforementioned structure in which the viewing region includes the first region and the second region, the second region is preferably arranged in a central portion of the viewing region of the board imaging portion and the first region is preferably arranged in an outer region of the viewing region of the board imaging portion outside the central portion, and the component mounting apparatus is preferably configured to correct the displacement of the board imaging portion from the board recognition position on the basis of an image of the imaging position correction mark imaged in the outer region of the viewing region of the board imaging portion through the first optical path and image the board in the central portion of the viewing region of the board imaging portion through the second optical path, when the board imaging portion is moved relative to the head portion to the board recognition position. According to this structure, the imaging position correction mark can be imaged, effectively using the outer region of the viewing region outside the central portion while the board is imaged in the central portion of the viewing region closer to the optical axis of the board imaging portion.

In this case, the first region is preferably arranged on each side of the second region along the moving direction of the board imaging portion relative to the head portion, and the imaging position correction mark is preferably provided in the head portion to be imaged in the first region arranged on each side of the second region. According to this structure, the amount of displacement of the board imaging portion including rotational components relative to the head portion in the plane of the mounting surface can be easily and accurately acquired on the basis of the image of the imaging position correction mark imaged in each of the two first regions arranged on both sides of the second region.

In the aforementioned structure in which the board imaging portion is movable relative to the head portion along the direction substantially perpendicular to the mounting surface of the board, the component mounting apparatus is preferably configured to acquire an image of the board in which the displacement has been corrected by reflecting the displacement of the board imaging portion relative to the head portion in the direction substantially perpendicular to the mounting surface of the board in the image data of the board imaged by the board imaging portion. According to this structure, when the board imaging portion is configured to be moved relative to the head portion in the direction substantially perpendicular to the mounting surface of the board so as to recognize the board, the correction data of the displacement of the board imaging portion relative to the head portion in the direction substantially perpendicular to the mounting surface can be properly reflected in the captured image data of the board, and the image (the corrected captured image data) of the board can be easily acquired.

In the aforementioned structure in which the board imaging portion is movable relative to the head portion along the direction substantially perpendicular to the mounting surface of the board, the board imaging portion preferably further includes a camera portion for board recognition and the camera portion is preferably configured to be movable to the board recognition position where the board can be imaged along the direction substantially perpendicular to the mounting surface of the board in the head portion, and the component mounting apparatus is preferably configured to acquire an image of the board in which the displacement has been corrected in a state where the magnification of the camera portion is adjusted on the basis of an image of the imaging position correction mark imaged by the camera portion when the camera portion is moved relative to the head portion to the board recognition position. According to this structure, even in the case where the camera portion images the board in a state where the camera portion is moved to a position slightly closer to or slightly farther from the mounting surface of the board beyond the proper board recognition position, the magnification of the camera portion is adjusted on the basis of the image of the imaging position correction mark imaged by the camera portion, and hence the image of the board corrected in accordance with the actual dimension (the corrected captured image data) can be acquired. Particularly when the camera portion having a fixed focal length is employed, the present invention is very useful since the image of the board in accordance with the actual dimension can be acquired regardless of the displacement of the camera portion.

The aforementioned component mounting apparatus according to the aspect preferably further includes a supporting member fixedly mounted in the vicinity of the board recognition position where the board imaging portion can image the board in the head portion, and the imaging position correction mark is preferably provided in the supporting member. According to this structure, as to a relative positional relation between the imaging position correction mark and the head portion, the imaging position correction mark and the head portion are integrated through the supporting member 57 fixedly mounted on the head portion, and hence the amount of displacement of the board imaging portion relative to the head portion grasped on the basis of the image of the imaging position correction mark imaged by the board imaging portion can be accurately grasped. Furthermore, the imaging position correction mark is provided in the head portion by using the supporting member, whereby an optical system around the board imaging portion can be easily configured.

In the aforementioned structure in which the board recognition position is provided in the vicinity of the end of the head portion, the imaging position correction mark is preferably provided at a position corresponding to each of the vicinity of a first end of the head portion and the vicinity of a second end of the head portion along the moving direction of the board imaging portion relative to the head portion, and the component mounting apparatus is preferably configured to correct the displacement on the basis of an image of the corresponding imaging position correction mark imaged by the board imaging portion in the vicinity of the first end or the vicinity of the second end when the board imaging portion is moved relative to the head portion to the vicinity of the first end of the head portion or the vicinity of the second end of the head portion. According to this structure, the displacement of the board imaging portion can be grasped at the board recognition position provided at the position corresponding to the vicinity of each end when the board imaging portion is moved to the position corresponding to the vicinity of the first end or the vicinity of the second end of the head portion, and hence an operation of recognizing the board can be efficiently performed even in the case where the board is imaged at a plurality of positions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 illustrates the detailed structure of a correction mark member mounted on the head unit through a supporting member in the component mounting apparatus according to the first embodiment of the present invention;

FIG. 6 illustrates that the displacement of the board imaging unit is corrected on the basis of an image of the correction mark member imaged by the board imaging unit in the component mounting apparatus according to the first embodiment of the present invention;

FIG. 7 illustrates a flow of processing performed by a main control portion when the board is recognized in the component mounting apparatus according to the first embodiment of the present invention;

FIG. 8 is a side elevational view showing a state where a board imaging unit is horizontally moved to the vicinity of a board recognition position in a head unit in a component mounting apparatus according to a second embodiment of the present invention;

DESCRIPTION OF THE PREFERRED EMBODIMENTS

Embodiments of the present invention are hereinabove described with reference to the drawings.

First Embodiment

The structure of a component mounting apparatus 100 according to a first embodiment of the present invention is now described with reference to FIGS. 1 to 6.

Figure 1:
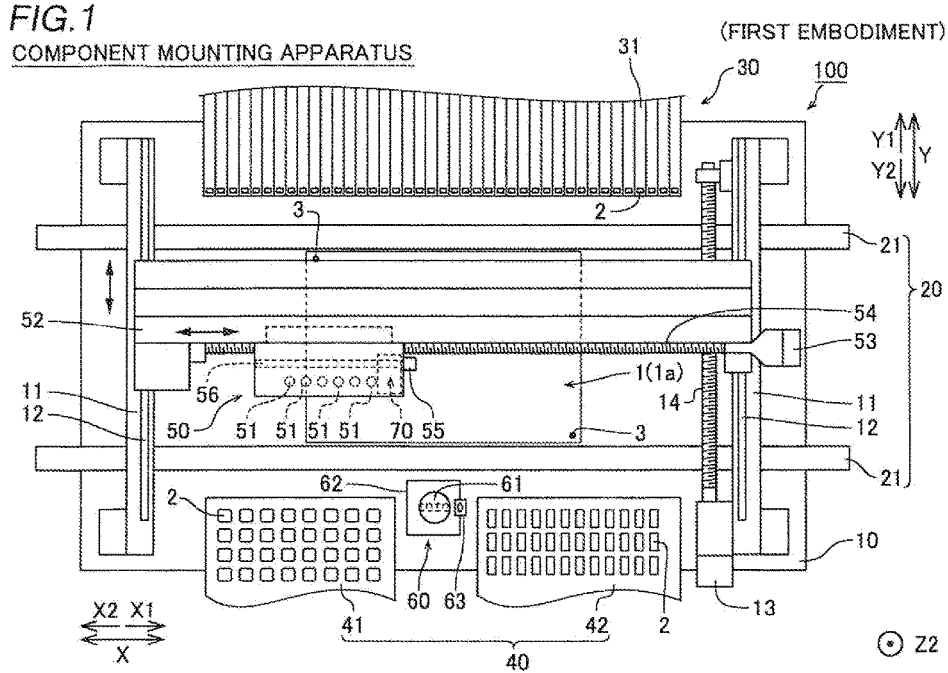
FIG. 1 is a top plan view showing the overall structure of a component mounting apparatus according to a first embodiment of the present invention.

The component mounting apparatus 100 according to the first embodiment of the present invention is an apparatus for mounting components 2 on a mounting surface 1a of a board 1 onto which cream solder (not shown) is printed at high speed with a head unit 50 described later, as shown in FIG. 1. The head unit 50 is an example of the "head portion" in the present invention.

The component mounting apparatus 100 includes a base 10, a board conveying portion 20 provided on the base 10 (the front side in the plane of the figure), component feeding portions 30 and 40 arranged on both sides (the Y1 and Y2 sides) of the board conveying portion 20, respectively, the head unit 50 movable along an X-Y plane above the board conveying portion 20 (the front side in the plane of the figure), a component imaging unit 60 imaging the unmounted components 2, a board imaging unit 70 imaging the board 1, and a controller 80 (see FIG. 3), as shown in FIG. 1. The board imaging unit 70 is an example of the "board imaging portion" in the present invention.

The board conveying portion 20 has a pair of conveyors 21 extending in the conveying direction (the direction X) of the board 1. The pair of conveyors 21 have a function of receiving the board 1 from one side (an X1 side), conveying the board 1 to a component mounting position, and holding the board 1 at the component mounting position. Furthermore, the conveyors 21 have a function of carrying the board 1 mounted with the components 2 out of the component mounting apparatus 100 to another side (an X2 side).

A plurality of tape feeders 31 aligned in the direction X are arranged in the component feeding portion 30 arranged on the rear side (the Y1 side) of the board conveying portion 20. The tape feeders 31 hold reels (not shown) on which tapes (not shown) holding a plurality of chip components (components 2) at prescribed intervals are wound. The component feeding portion 30 intermittently sends out the tapes from the tape feeders 31, whereby the chip components on the tapes are fed to component feeding positions in the vicinity of the board conveying portion 20. The chip components denote small pieces of electronic components such as LSIs, ICs, transistors, capacitors, and resistors.

Trays 41 and 42 are arranged at a prescribed interval in the direction X in the component feeding portion 40 arranged on the front side (the Y2 side) of the board conveying portion 20. An aligned large package components such as QFPs (quad flat packages) and BGAs (ball grid arrays) are placed on the trays 41 and 42 to be capable of being picked up by the head unit 50.

Figure 2:
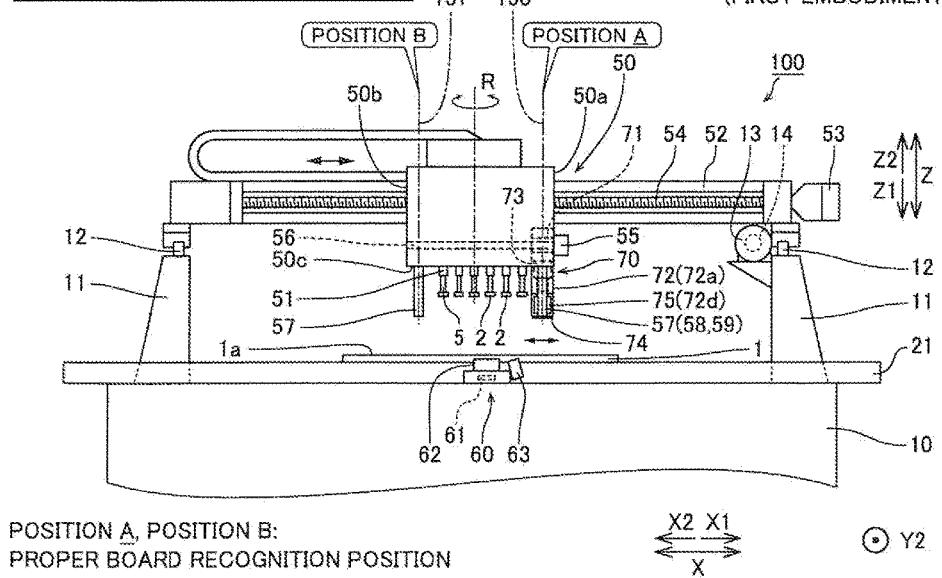
FIG. 2 is a front elevational view showing the overall structure of the component mounting apparatus according to the first embodiment of the present invention.

The head unit 50 has a function of transporting the components 2 fed from the component feeding portions 30 and 40 to prescribed positions over the board 1 while temporarily suctioning/holding the components 2 and mounting the components 2 on the board 1 at the positions, as shown in FIGS. 1 and 2. Specifically, a plurality of (six) mounting heads 51 arranged in a line along the direction X are exposed downward on the lower surface of the head unit 50. In addition, component suction nozzles 5 whose tips are directed downward (along arrow Z1) are mounted on the mounting heads 51. Thus, the components 2 are suctioned by negative pressure generated at the lower ends of the nozzles 5 by a negative pressure generator (not shown) provided in the component mounting apparatus 100 when the components 2 are mounted.

The head unit 50 is movably supported by a supporting portion 52 extending in the direction X above the base 10. An X-axis servomotor 53 provided on the supporting portion 52 rotates a ball screw shaft 54, whereby the head unit 50 is moved in the direction X. A pair of elevated frames 11 extending in a direction Y are arranged on the upper surface of the base 10 and are provided with a Y-axis servomotor 13 and a ball screw shaft 14. The supporting portion 52 bridges between the elevated frames 11 through a pair of fixed rails 12 in the direction X. The Y-axis servomotor 13 rotates the ball screw shaft 14, whereby the supporting portion 52 is moved in the direction Y on the elevated frames 11. Thus, the head unit 50 is configured to be movable to an arbitrary position in the X-Y plane over the base 10 by rotating the ball screw shafts 54 and 14. In addition, an X-axis servomotor 55 is mounted on a side end 50a of the head unit 50 on one side (the X1 side) close to the rear side (the Y1 side) below the supporting portion 52, and a ball screw shaft 56 (shown by a broken line) extending in the direction X on the rear side of the head unit 50 is rotatably mounted on the X-axis servomotor 55.

As shown in FIG. 2, the mounting heads 51 are configured to be elevatable in a direction Z and to be rotated horizontally (in a direction R) about vertical axes (in the direction Z) passing through the centers of the nozzles 5. Thus, the component mounting apparatus 100 is configured to adjust states of holding (suctioning) the components 2 in the X-Y plane while the nozzles 5 suction the components 2.

The component imaging unit 60 is provided on the base 10 and is fixedly set between the tray 41 and the tray 42 in a plan view, as shown in FIG. 1. The component imaging unit 60 includes a camera portion 61, a case body 62 housing the camera portion 61, and a lighting portion 63 for imaging the components 2 provided on the case body 62. The component imaging unit 60 has a function of imaging the lower surface shapes of the unmounted components 2 picked up from the component feeding portions 30 and 40 (see FIG. 1) by the head unit 50 from the lower surface side (the Z1 side) with the camera portion 61 immediately before mounting, as shown in FIG. 2. Thus, the component mounting apparatus 100 (see FIG. 1) recognizes how the components 2 are held (suctioned) with respect to the nozzles 5 immediately before mounting.

According to the first embodiment, the board imaging unit 70 for imaging the board 1 is provided on the head unit 50 to be movable in the direction X relative to the head unit 50, as shown in FIG. 2. In other words, the board imaging unit 70 is provided with a nut member 71 (shown by a broken line) meshing with the ball screw shaft 56, and the X-axis servomotor 55 rotates the ball screw shaft 56, whereby along with the nut member 71, the board imaging unit 70 is horizontally moved along arrow X1 or X2 substantially parallel to the mounting surface 1a of the board 1 on the rear side (the Y1 side) of the head unit 50. In this case, the board imaging unit 70 is configured to be linearly movable between a position A corresponding to a region between a mounting head 51 (a nozzle 5) of the head unit 50 arranged closest to the X1 side and the side end 50a and a position B corresponding to a region between a mounting head 51 (a nozzle 5) arranged closest to the X2 side and a side end 50b, as shown in FIG. 2. The position A and the position B in FIG. 2 are positions corresponding to centerlines 150 and 151 (in the direction Z) of supporting members 57 described later, respectively. The position A and the position B are examples of the "board recognition position" in the present invention. The side ends 50a and 50b are examples of the "first end" and the "second end" in the present invention, respectively.

Figure 4:
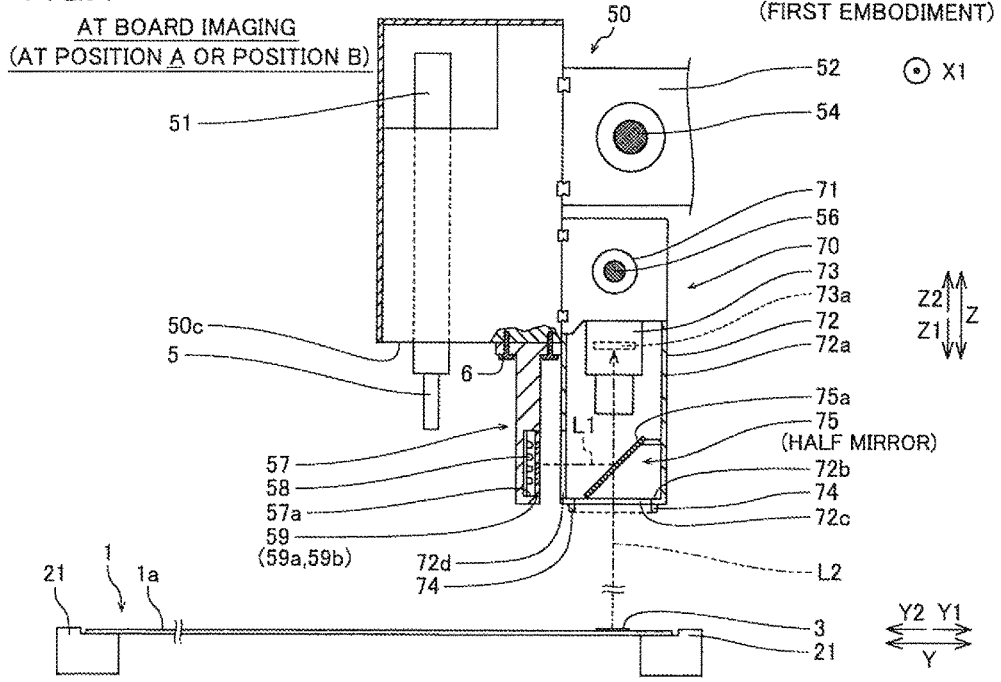
FIG. 4 is a side elevational view showing a state where a board imaging unit is horizontally moved to the vicinity of a board recognition position in a head unit in the component mounting apparatus according to the first embodiment of the present invention.

The board imaging unit 70 includes a case body 72 in which the nut member 71 is incorporated, configured to be slidable in the direction X relative to the head unit 50, a camera portion 73 fixed in the case body 72 in a state where a lens portion (not shown) thereof is directed downward, and a lighting portion 74 for imaging the board 1 mounted on a prescribed position of the lower surface of the case body 72, as shown in FIG. 4. The case body 72 has a tubular (square tubular) cross section and a tubular portion 72a surrounding the camera portion 73, extending downward (along arrow Z1). Therefore, the case body 72 is suspended downward from the rear side of the head unit 50.

A mirror member 75 having a reflective surface 75a is fixedly provided on a lower end 72b of the tubular portion 72a below the camera portion 73 in the case body 72. The mirror member 75 is an example of the "optical member" in the present invention. The reflective surface 75a of the mirror member 75 is directed to the front side (the Y2 side), and the mirror member 75 is fixed to be inclined at 45 degrees with respect to a horizontal plane. An opening 72c opening downward is formed in the lower end 72b on which the mirror member 75 is arranged. The lighting portion 74 including LEDs is circumferentially mounted along the edge of the opening 72c to be directed downward (to the board 1). The mirror member 75 includes a half mirror and is so configured that the reflective surface 75a thereof can transmit light upward (along arrow Z2). A rectangular opening 72d is formed in a wall surface of the tubular portion 72a on the front side (the Y2 side). The opening 72d opens throughout a height region corresponding to the reflective surface 75a of the mirror member 75.

According to the first embodiment, the head unit 50 includes the supporting members 57 made of steel, for example, having prescribed rigidity, as shown in FIG. 4. The supporting members 57 each have a base portion fixedly set on the lower surface 50c with a plurality of screw members 6 and extend vertically downward from the lower surface 50c of the head unit 50. Furthermore, the supporting members 57 each have a concave portion 57a formed by concaving a surface on the Y1 side in the vicinity of a lower end (on the Z1 side). A lighting portion 58 including LED elements and a printed board is mounted along the substantially flat bottom surface of the concave portion 57a, and a correction mark member 59 made of a glass plate is mounted substantially parallel to the lighting portion 58 at a slight clearance (along arrow Y1) from the lighting portion 58.

When a portion of each of the supporting members 57 on which the correction mark member 59 is mounted is viewed from the rear side (the Y1 side) of the head unit 50, the concave portion 57a of each of the supporting members 57 has a substantially rectangular shape, as shown in FIG. 5, and the correction mark member 59 is fitted into the substantially rectangular concave portion 57a and is fixed with an adhesive (not shown). The correction mark member 59 has a transparent transmission portion 59a having a substantially square shape in a central portion and a light shielding portion 59b onto which a black coating material is applied (evaporated) to surround the transmission portion 59a. Therefore, the correction mark member 59 is so configured that light of the lighting portion 58 is emitted to the front side in the plane of the figure (the Y1 side) only through the transmission portion 59a of the correction mark member 59 when the lighting portion 58 arranged behind is turned on. The correction mark member 59 having the transmission portion 59a and the light shielding portion 59b is an example of the "imaging position correction mark" in the present invention.

The respective supporting members 57 mounted with correction mark members 59 are set on the lower surface 50c at the position A corresponding to the vicinity of the side end 50a of the head unit 50 and the position B corresponding to the vicinity of the side end 50b of the head unit 50, as shown in FIG. 2. Therefore, the component mounting apparatus 100 is so configured that the opening 72d (the mirror member 75) of the case body 72 and a supporting member 57 (a correction mark member 59) are opposed to each other in the direction Y when the board imaging unit 70 is moved to the vicinity of the position A or the position B, as shown in FIG. 4. According to the first embodiment, the following operation processing is internally performed when the board 1 is recognized (the conveyance state of the board 1 is recognized) with the board imaging unit 70 before mounting of the components 2.

Specifically, when the board imaging unit 70 is moved to the vicinity of the position A (or the position B) as the board recognition position in the head unit 50, an image of the board 1 can be obtained while the displacement of the board imaging unit 70 (the optical axis of the camera portion 73) from the board recognition position (the centerline 150 in the case of the position A and the centerline 151 in the case of the position B) in the head unit 50 is corrected (reflected), as shown in FIG. 2. In other words, when the board imaging unit 70 is moved to the position A (see FIG. 2), for example, as shown in FIG. 4, the amount of displacement of the board imaging unit 70 relative to the head unit 70 (the amount of displacement of the optical axis of the camera portion 73 from the proper position A) grasped on the basis of an image of the correction mark member 59 imaged by the board imaging unit 70 is grasped by the controller 80 (see FIG. 3), and arithmetic processing for reflecting the amount of displacement grasped by the controller 80 in the image of the board 1 is performed. The amount of displacement of the board imaging unit 70 relative to the head unit 50 is an example of the "displacement information" in the present invention.

Therefore, even in the case where the board imaging unit 70 (the optical axis of the camera portion 73) is moved to a position displaced by a prescribed amount from the position A and images the board 1 at this position, the image of the board 1 is acquired as image data (positional information of a board recognition mark 3) in which the amount of displacement of the board imaging unit 70 from the proper position A is reflected. Thus, the image (captured image data) of the board 1 (the board recognition mark 3) is corrected by the amount of displacement, so that the image (the corrected captured image data) of the board 1 substantially identical to that in the case of imaging the board recognition mark 3 at the position A (the proper board recognition position) for imaging the board 1 without displacement of the board imaging unit 70 is obtained on control data.

On this point, the case where the board imaging unit 70 is moved to the vicinity of the position A (see FIG. 2) as the proper board recognition position is described in detail as an example. More specifically, when the board imaging unit 70 is moved to the vicinity of the position A in the head unit 50, as shown in FIG. 4, the lighting portion 58 is first turned on. Then, an optical path L1 starting from a surface of the correction mark member 59, passing through the opening 72d, reflected in a substantially perpendicular direction by the reflective surface 75a of the mirror member 75, and reaching an imaging element 73a of the camera portion 73 directly above the mirror member 75 is formed in the case body 72. Thus, the correction mark member 59 is first imaged through this optical path L1 by the camera portion 73. The optical path L1 is an example of the "first optical path" in the present invention. Consequently, whereas the light shielding portion 59b of the correction mark member 59 shields the light of the lighting portion 58, the transmission portion 59a transmits the light so that the imaging element 73a (see FIG. 4) forms an image of the light through the optical path L1, as shown in FIG. 5. Therefore, the transmission portion 59a formed in a substantially square shape with four corners is imaged as a white actual image 103 in a viewing region 101 of the camera portion 73 (the imaging element 73a), as shown in FIG. 6. In FIG. 6, a portion of the viewing region 101 other than the transmission portion 59a is shown in white for convenience of illustration, but the black light shielding portion 59b (see FIG. 5) is actually imaged in dark color in the portion of the viewing region 101 other than the transmission portion 59a. The transmission portion 59a is an example of the "figure having corners" in the present invention.

When the board imaging unit 70 is moved to the vicinity of the position A, the board imaging unit 70 is expected to be moved to position coordinates (the position coordinates of the centerline 150 in FIG. 2) corresponding to the board recognition position (imaging position) stored in a storage portion 82 (see FIG. 3) of the controller 80 and stand still on control. When the correction mark member 59 (see FIG. 5) is imaged in a state where the board imaging unit 70 (the camera portion 73) is accurately moved to the position coordinates of the board recognition position (without displacement) on control, an image of the transmission portion 59a can be captured as a white virtual figure 102 at a position shown by a two-dot chain line in the viewing region 101 of the camera portion 73, as shown in FIG. 6. However, actually, the position coordinates of the board imaging unit 70 on control estimated by an unshown encoder (position detection sensor) of the ball screw shaft 56 (see FIG. 2) driving the board imaging unit 70 may be displaced by a prescribed amount from position coordinates on control (an accurate board recognition position) due to inertial force at the time of rotation of the ball screw shaft 56 by the X-axis servomotor 55 (see FIG. 2), shaft elongation following heat generation of the ball screw shaft 56, etc. In other words, when the position coordinates of the board imaging unit 70 (the camera portion 73) actually moved are displaced from the position coordinates on control, the image of the transmission portion 59a is captured as the white actual image 103 at a region shown by a bold solid line in the viewing region 101 in FIG. 6. In short, the virtual figure 102 does not completely overlap with the actual image 103. In FIG. 6, a state where the actual image 103 is captured in a state displaced from the virtual figure 102 is shown with slight exaggeration for convenience of description.

Figure 3:
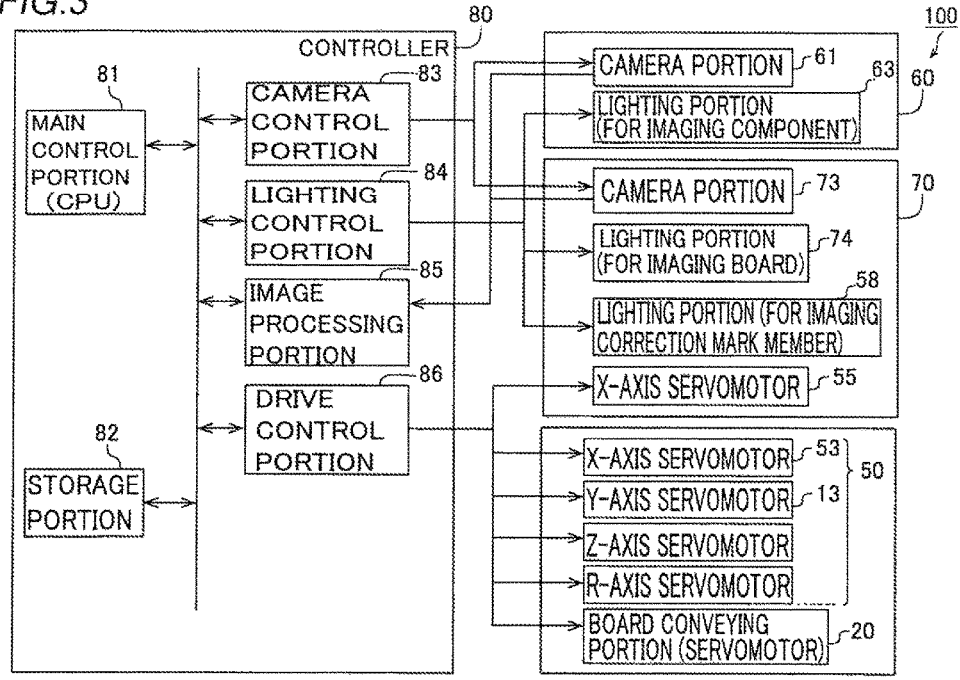
FIG. 3 is a block diagram showing the control structure of the component mounting apparatus according to the first embodiment of the present invention.

Therefore, according to the first embodiment, the component mounting apparatus 100 is configured to calculate the "amount of geometric displacement" of the actual image 103 from the virtual figure 102 based on the captured actual image 103 by a main control portion 81 (see FIG. 3) on the basis of prescribed image processing performed by an image processing portion 85 (see FIG. 3). The virtual figure 102 itself is previously stored as image data (reference image data) captured when the board imaging unit 70 (the camera portion 73) is moved to the position coordinates of the board recognition position on control without displacement in the controller 80. The amount of displacement of the actual image 103 from the virtual figure 102 includes the amount of rotational displacement of the board imaging unit 70 about a Z-axis in the direction R in the X-Y plane in addition to the amounts of displacement of the board imaging unit 70 in the direction X and the direction Y with respect to the head unit 50. In other words, the amount of displacement of the actual image 103 from the virtual figure 102 calculated by the main control portion 81 is equal to the amount of displacement of the board imaging unit 70 from the proper board recognition position (the position A) in the case where the board imaging unit 70 is moved relative to the head unit 50. Thus, in the component mounting apparatus 100, this amount of displacement is grasped on the basis of the image processing performed by the image processing portion 85, whereby the amount of displacement of the board imaging unit 70 from the proper board recognition position (the position A) is grasped by the controller 80. The transmission portion 59a has a substantially square shape with four corners, and hence the amount of rotational displacement of the actual image 103 from the virtual figure 102 is also easily grasped on the basis of image processing of the actual image 103 obtained by imaging this transmission portion 59a having corners.

Thereafter, the lighting portion 58 is turned off and the lighting portion 74 is turned on, whereby the board imaging unit 70 actually images the board recognition mark 3 of the board 1, as shown in FIG. 4. In other words, an optical path L2 starting from the side of the mounting surface 1a of the board 1, passing through the opening 72c, transmitted through the mirror member 75 along arrow Z2, and reaching the imaging element 73a of the camera portion 73 is formed in the case body 72. Thus, the camera portion 73 images the board recognition mark 3 of the board 1 through this optical path L2. In this case, the board recognition mark 3 is imaged in the viewing region 101 (see FIG. 6) in a state where the board imaging unit 70 (the camera portion 73) is displaced from the exact board recognition position (the position A). The optical path L2 is an example of the "second optical path" in the present invention.

At this time, according to the first embodiment, despite imaging of the board recognition mark 3 in the state where the board imaging unit 70 (the camera portion 73) is displaced from the proper board recognition position (the position A), the positional information of the board recognition mark 3 is acquired as the captured image data corrected by the "amount of displacement" of the board imaging unit 70 from the board recognition position (the position A) acquired when the correction mark member 59 is previously imaged. Thus, the position coordinates of the board recognition mark 3 whose positional information has been corrected on the control data become substantially equal to the position coordinates of the board recognition mark 3 in the case where the board imaging unit 70 images the board recognition mark 3 at the proper board recognition position (the position A). The correction mark member 59 is so provided in the head unit 50 that the length of the optical path L1 for imaging the correction mark member 59 by the board imaging unit 70 becomes substantially equal to the length of the optical path L2 for imaging the board 1 by the board imaging unit 70.

The case where the board imaging unit 70 is moved to the vicinity of the position A as the proper board recognition position is described above, but also in the case where the board imaging unit 70 is moved to the vicinity of the position B (the position of the centerline 151 in FIG. 2) as the board recognition position, the same arithmetic processing is performed. In other words, the amount of displacement of the board imaging unit 70 from the proper board recognition position (the position B) is reflected also in an image of the board recognition mark 3 of the board 1 imaged in the vicinity of the position B.

In the component mounting apparatus 100, the board imaging unit 70 images the board recognition mark 3 of the board 1 in this manner, whereby the exact position of the board 1 conveyed to the component mounting position by the board conveying portion 20 is recognized.

The controller 80 controls the overall operation of the component mounting apparatus 100 relating to a component mounting operation, as shown in FIG. 3. Specifically, the controller 80 includes the main control portion 81 including the a CPU, the storage portion 82, a camera control portion 83, a lighting control portion 84, the image processing portion 85, and a drive control portion 86.

The storage portion 82 stores information capable of specifying the respective components, such as the component names, the component numbers, and the shapes of the mounted components 2 in addition to a mounting program. This information is previously registered in the component mounting apparatus 100 through an unshown input device (a PC terminal) when an operator replenishes the tape feeder 31, the trays 41 and 42 (see FIG. 1), or the like with the components 2. The main control portion 81 has a function of driving the board conveying portion 20, the head unit 50, the component imaging unit 60, and the board imaging unit 70 through the drive control portion 86 on the basis of the mounting program and the information regarding the components 2 registered in the storage portion 82 to execute a component mounting operation.

The camera control portion 83 has a function of driving the camera portion 61 of the component imaging unit 60 and the camera portion 73 of the board imaging unit 70 under prescribed imaging conditions to perform an imaging operation. The lighting control portion 84 has a function of causing the lighting portion 63 for imaging the components 2 to operate in association with the imaging operation of the camera portion 61. Furthermore, the lighting control portion 84 has a function of causing the lighting portion 58 for imaging the correction mark member 59 and the lighting portion 74 for imaging the board 1 to operate in association with the imaging operation of the camera portion 73. The image processing portion 85 has a function of performing prescribed image processing on image data acquired by the camera portion 61 and the camera portion 73. The drive control portion 86 has a function of driving the X-axis servomotor 55 and the like to drive the board imaging unit 70. The main control portion 81 is configured to recognize how the components 2 (see FIG. 2) suctioned by the nozzles 5 are held and the board 1 (the board recognition mark 3 (see FIG. 4)) on the basis of results (images) of the image processing performed by the image processing portion 85. The component mounting apparatus 100 according to the first embodiment is configured in this manner.

Control processing performed by the controller 80 (the main control portion 81) (see FIG. 3) to perform operations of mounting the components 2 in the component mounting apparatus 100 is now described with reference to FIGS. 1 to 7. Control processing performed by the main control portion 81 to recognize the position (conveyed position) of the board 1 conveyed to the component mounting apparatus 100 before the components 2 are mounted on the board 1 is described below.

First, the main control portion 81 (see FIG. 3) drives the board conveying portion 20 (see FIG. 1) having the pair of conveyors 21 (see FIG. 1), and the board 1 (see FIG. 1) after solder-printing is carried into the prescribed component mounting position in the component mounting apparatus 100 (see FIG. 1). Then, the board 1 is clamped to the component mounting position in the conveyors 21.

Thereafter, the main control portion 81 (see FIG. 3) moves the board imaging unit 70 (see FIG. 1) toward position coordinates where the board recognition mark 3 (see FIG. 1) applied to the board 1 (see FIG. 1) fixed to the component mounting position exists at a step S1, as shown in FIG. 7. More specifically, the type of the board 1 carried into the component mounting position is previously grasped on the basis of the mounting program, and hence the head unit 50 (see FIG. 1) is moved so that the board imaging unit 70 (the camera portion 73 (see FIG. 4)) is located at the position coordinates where the board recognition mark 3 applied to the board 1 exists. At this time, the board imaging unit 70 is also moved relative to the head unit 50 toward the position A (see FIG. 2) in the head unit 50. Thus, the board imaging unit 70 (the camera portion 73) is moved to the position coordinates of the board recognition mark 3 previously stored in the storage portion 82 (see FIG. 3) at the step S1.

Then, the main control portion 81 turns on the lighting portion 58 (see FIG. 4) for imaging the correction mark member 59 when the board imaging unit 70 (the case body 72) stops at the vicinity of the position A, for example at a step S2, as shown in FIG. 7. In this state, the board imaging unit 70 is moved to the position coordinates of the board recognition mark 3 stored in the storage portion 82 (see FIG. 3) on control. Therefore, the board imaging unit 70 stops at the vicinity of a position where the supporting member 57 (see FIG. 4) is provided in the vicinity of the position A. The board imaging unit 70 is expected to stop at the position A on control. Then, the main control portion 81 images the correction mark member 59 in a state lighted from behind by the lighting portion 58 with the board imaging unit 70 (the camera portion 73) at a step S3.

Thus, the actual image 103 of the transmission portion 59*a* of the correction mark member 59 is acquired in a state shown in FIG. 6 in the viewing region 101 of the camera portion 73 (see FIG. 4). In this case, the actual image 103 of the transmission portion 59*a* formed in the viewing region 101 is displaced by a prescribed amount from the virtual figure 102 of the transmission portion 59*a* imaged at the position A (the proper board recognition position) on control.

Therefore, according to the first embodiment, the main control portion 81 calculates the amount of displacement of the board imaging unit 70 from the position A (the board recognition position) at a step S4. In other words, the main control portion 81 calculates the "amount of geometric displacement" of the actual image 103 from the virtual figure 102 (a reference position) based on the captured actual image 103 of the correction mark member 59 by the main control portion 81 on the basis of the image processing performed by the image processing portion 85 (see FIG. 3), as shown in FIG. 6. Thus, the controller 80 (see FIG. 3) grasps the amount of displacement (including the amount of displacement in the direction X, the amount of displacement in the direction Y, and the amount of rotational displacement in the direction R) of the actual image 103 from the virtual figure 102.

Then, the main control portion 81 turns off the lighting portion 58 (see FIG. 4) at a step S5. Furthermore, the main control portion 81 turns on the lighting portion 74 (see FIG. 4) for imaging the board 1 at a step S6. At a step S7, the main control portion 81 images the board recognition mark 3 applied to the board 1 with the board imaging unit 70 (the camera portion 73).

According to the first embodiment, processing for correcting the image of the board recognition mark 3 imaged by the board imaging unit 70 by the amount of displacement of the board imaging unit 70 from the position A (the board recognition position) calculated at the previous step S4 on data is performed at a step S8. Thus, the positional information of the board recognition mark 3 whose position has been corrected on control data becomes substantially equal to the positional information of the board recognition mark 3 in the case where the board imaging unit 70 images the board recognition mark 3 at the proper board recognition position (the position A).

Then, the main control portion 81 turns off the lighting portion 74 at a step S9. Thereafter, the main control portion 81 determines whether or not another board recognition mark 3 exists at a step S10. When determining that another board recognition mark 3 exists at the step S10, the main control portion 81 returns to the step S1 and repeats the subsequent processing. When determining that no other board recognition mark 3 exists at the step S10, the main control portion 81 terminates this control processing. Although the case where the board imaging unit 70 is moved to the vicinity of the position A as the board recognition position is described above as an example, also in the case where the board imaging unit 70 is moved to the vicinity of the position B (see FIG. 2) as the board recognition position and recognizes the board recognition mark 3, the same control processing is performed.

In the component mounting apparatus 100, the operations of mounting the components 2 are performed on the basis of the control of the main control portion 81 after the aforementioned control processing is terminated.

In other words, on the basis of the mounting program, the head unit 50 (see FIG. 1) is sequentially moved over the component feeding portions 30 and 40 (see FIG. 1) from an initial position, and the tips (the lower ends) of the nozzles 5 (see FIG. 2) suction the components 2 (see FIG. 2). The nozzles 5 suction at most six components 2. After the nozzles 5 suction the components 2, the head unit 50 passes over the component imaging unit 60 along arrow X1, as shown in FIG. 2. At this time, the lighting portion 63 is turned on immediately before the respective components 2 that are objects to be imaged come over the component imaging unit 60 and continues to be on until all the components 2 pass over the component imaging unit 60. In the meantime, the camera portion 61 sequentially images the components 2 being held (suctioned) by the nozzles 5 immediately before mounting.

When the lighting portion 63 is turned off and the board imaging unit 70 finishes imaging the components 2, the main control portion 81 (see FIG. 3) recognizes how the components 2 are suctioned (the displacement or inclination of the components 2 with respect to the respective mounting heads 51 in the direction X, the direction Y, and the direction R), the presence of defects in the components 2, etc. on the basis of images of the components 2 imaged by the board imaging unit 70. Then, if there is any defective component or any component whose suction position cannot be corrected in the imaged components 2, such a component is registered as a component to be discarded, and thereafter normal components 2 other than the component to be discarded are sequentially mounted on the board 1.

On the basis of a result of recognition of the board 1, the main control portion 81 (see FIG. 5) performs control of correcting the position (in the direction X and the direction Y) of the head unit 50, the rotational angles (in the direction R) of the mounting heads 51, etc. so that the components 2 are mounted on appropriate positions. Then, the operations of mounting the components 2 (see FIG. 1) on the board 1 are performed. In this manner, one cycle of the operations of mounting the components 2 is terminated. On the basis of the mounting program, the aforementioned operations are repeated.

According to the first embodiment, as hereinabove described, the component mounting apparatus 100 includes the board imaging unit 70 provided on the head unit 50 to be movable relative to the head unit 50 and the correction mark members 59 provided in the head unit 50 to be capable of being imaged by the board imaging unit 70 and is configured to correct the displacement of the board imaging unit 70 relative to the head unit 50 on the basis of the images of the correction mark members 59 imaged by the board imaging unit 70, whereby the displacement of the board imaging unit 70 relative to the head unit 50 grasped on the basis of the image of the correction mark member 59 imaged by the board imaging unit 70 can be reflected also in the image of the board 1 (the board recognition mark 3) when the board imaging unit 70 is moved relative to the head unit 50 and images the board 1 at the position A (the position B) for imaging the board 1. In other words, the image of the board 1 (the board recognition mark 3) in which the displacement of the board imaging unit 70 relative to the head unit 50 has been corrected (reflected) can be obtained, and hence the exact position of the board 1 can be grasped and the board 1 can be accurately recognized even in the case where the board imaging unit 70 is provided on the head unit 50 to be movable relative to the head unit 50 so as to recognize the board 1.

According to the first embodiment, the board imaging unit 70 is configured to be movable to the position A (the position B) as the board recognition position where the board 1 can be imaged in the head unit 50, and the component mounting apparatus 100 is configured to correct the displacement of the board imaging unit 70 from the position A (the position B) in the head unit 50 on the basis of the image of the correction mark member 59 imaged by the board imaging unit 70. Thus, the displacement of the board imaging unit 70 from the position A (the position B) in the head unit 50 grasped on the basis of the image of the correction mark member 59 imaged by the board imaging unit 70 can be reflected in the image of the board 1 (the board recognition mark 3) when the board imaging unit 70 is moved relative to the head unit 50 and images the board 1 at the position A (the position B).

According to the first embodiment, the image of the correction mark member 59 imaged by the board imaging unit 70 includes the amount of displacement (the displacement information) grasped in the case where the board imaging unit 70 images the correction mark member 59 with displacement relative to the head unit 50, based on the case where the board imaging unit 70 images the correction mark member 59 without displacement relative to the head unit 50. Furthermore, the component mounting apparatus 100 is configured to acquire the image of the board 1 in which the displacement of the board imaging unit 70 relative to the head unit 50 has been corrected by reflecting the displacement of the board imaging unit 70 relative to the head unit 50 based on the amount of displacement (the displacement information) in the image data of the board 1 imaged by the board imaging unit 70. Thus, effectively using the amount of displacement grasped on the basis of the image of the correction mark member 59 in the case where the board imaging unit 70 is actually displaced from the design reference position where the board imaging unit 70 is not displaced, correction data of the displacement of the board imaging unit 70 relative to the head unit 50 can be properly reflected in the image data of the board 1 imaged by the displaced board imaging unit 70, and the image (the corrected image data) of the board 1 can be easily acquired.

According to the first embodiment, the board imaging unit 70 is configured to be movable relative to the head unit 50 along the direction X substantially parallel to the mounting surface 1a of the board 1 on which the components 2 are mounted. Furthermore, the component mounting apparatus 100 is configured to correct the displacement of the board imaging unit 70 relative to the head unit 50 in the direction substantially parallel to the board 1 (the mounting surface 1a) on the basis of the image of the correction mark member 59 imaged by the board imaging unit 70. Thus, the position of the board imaging unit 70 in the X-Y plane (in the horizontal plane) of the board 1 can be grasped with a high degree of accuracy even in the case where the board imaging unit 70 is configured to be moved relative to the head unit 50 in a direction along the mounting surface 1a of the board 1 so as to recognize the board 1.

According to the first embodiment, the component mounting apparatus 100 is configured to acquire the image of the board 1 in which the displacement has been corrected by reflecting the displacement of the board imaging unit 70 relative to the head unit 50 in the direction substantially parallel to the mounting surface 1a of the board 1 in the image data of the board 1 imaged by the board imaging unit 70. Thus, when the board imaging unit 70 is configured to be moved relative to the head unit 50 in the in-plane direction of the mounting surface 1a of the board 1 so as to recognize the board 1 (the board recognition mark 3), the correction data of the displacement of the board imaging unit 70 relative to the head unit 50 in the direction substantially parallel to the mounting surface 1a can be properly reflected in the captured image data of the board 1, and the image (the corrected captured image data) of the board 1 can be easily acquired.

According to the first embodiment, the correction mark member 59 includes the substantially square transmission portion 59a having corners, and the component mounting apparatus 100 is configured to correct the displacement of the board imaging unit 70 relative to the head unit 50 in the direction substantially parallel to the mounting surface 1a of the board 1 on the basis of the image of the transmission portion 59a imaged by the board imaging unit 70. Thus, the amount of displacement of the board imaging unit 70 including rotational components relative to the head unit 50 in the plane of the mounting surface 1a can be easily and accurately acquired on the basis of the image processing of the actual image 103 of the transmission portion 59a including the figure having corners, constituting the correction mark member 59.

According to the first embodiment, the correction mark member 59 is provided at a position corresponding to the position A (the position B) as the board recognition position where the board imaging unit 70 can image the board 1 in the head unit 50. Furthermore, the component mounting apparatus 100 is configured to correct the displacement of the board imaging unit 70 from the position A (the position B) in the head unit 50 on the basis of the image of the correction mark member 59 imaged by the board imaging unit 70 when the board imaging unit 70 is moved relative to the head unit 50 to the vicinity of the position A (the position B). Thus, the displacement of the board imaging unit 70 from the position A (the position B) can be easily grasped by imaging the correction mark member 59 provided at the position A (the position B) for imaging the board 1, unlike the case where the correction mark member 59 is provided at a position different from the position A (the position B) of the head unit 50. Therefore, the board imaging unit 70 can easily image the board 1 (the board recognition mark 3) in a state where the displacement of the board imaging unit 70 from the position A (the position B) in the head unit 50 is grasped on the basis of the image of the correction mark member 59.

According to the first embodiment, the mirror member 75 including the half mirror is provided in the board imaging unit 70. Furthermore, the component mounting apparatus 100 is configured to correct the displacement of the board imaging unit 70 from the position A (the position B) on the basis of the image of the correction mark member 59 imaged in the viewing region 101 of the board imaging unit 70 through the optical path L1 formed by the mirror member 75 and image the board 1 (the board recognition mark 3) in the viewing region 101 of the board imaging unit 70 through the optical path L2 formed by the mirror member 75, when the board imaging unit 70 is moved relative to the head unit 50 to the vicinity of the position A (the position B). Thus, the displacement of the board imaging unit 70 from the position A (the position B) can be corrected by imaging the correction mark member 59 in the single viewing region 101 of the board imaging unit 70 through the optical path L1 with the mirror member 75, and the board 1 can be imaged in the viewing region 101 by switching from the optical path L1 to the optical path L2. Thus, effectively using the viewing region 101 of the camera portion 73, the displacement of the board imaging unit 70 from the position A (the position B)

can be corrected, and the board 1 (the board recognition mark 3) can be easily imaged.

According to the first embodiment, the correction mark member 59 is so provided in the head unit 50 that the length of the optical path L1 for imaging the correction mark member 59 with the board imaging unit 70 becomes substantially equal to the length of the optical path L2 for imaging the board 1 with the board imaging unit 70. Thus, the focal length of the board imaging unit 70 in the case of imaging the correction mark member 59 through the optical path L1 can be rendered substantially equal to the focal length of the board imaging unit 70 in the case of imaging the board 1 through the optical path L2, and hence even the board imaging unit 70 (the camera portion 73) whose focal length is set as a fixed value can accurately recognize the board 1 (the board recognition mark 3).

According to the first embodiment, the optical path L1 is an optical path formed to capture the image of the correction mark member 59 reflected by the mirror member 75 with the board imaging unit 70, and the optical path L2 is an optical path formed to capture the image of the board 1 transmitted through the mirror member 75 with the board imaging unit 70. Thus, in the structure of the board imaging unit 70 directly imaging the board 1 through the optical path L2 transmitted through the mirror member 75, the displacement of the board imaging unit 70 with respect to the head unit 50 can be easily grasped using the optical path L1 for capturing the image of the correction mark member 59 reflected by the mirror member 75 with the board imaging unit 70 prior to imaging of the board 1. In addition, the board recognition mark 3 can be recognized by imaging the board 1 through the optical path L2 without changing the optical axis of the board imaging unit 70 with respect to the board 1.

According to the first embodiment, the component mounting apparatus 100 is configured to correct the displacement of the board imaging unit 70 relative to the head unit 50 on the basis of the image of the correction mark member 59 imaged by the board imaging unit 70 when the board imaging unit 70 is moved relative to the head unit 50 to the position corresponding to the vicinity of the side end 50a or 50b of the head unit 50 in the direction X. Thus, the displacement of the board imaging unit 70 relative to the head unit 50 can be corrected by simply moving the board imaging unit 70 to the position corresponding to the vicinity of the side end 50a or 50b of the head unit 50. Therefore, the board imaging unit 70 can accurately recognize the board 1 in a state where the board imaging unit 70 is moved to the position corresponding to the vicinity of the side end 50a or 50b of the head unit 50.

According to the first embodiment, the position A and the position B as the board recognition positions are provided in the vicinity of the side ends 50a and 50b of the head unit 50, respectively, and the component mounting apparatus 100 is configured to correct the displacement of the board imaging unit 70 from the position A (the position B) in the head unit 50 on the basis of the image of the correction mark member 59 imaged by the board imaging unit 70 when the board imaging unit 70 is moved relative to the head unit 50 to the vicinity of the side end 50a or 50b. Thus, the displacement of the board imaging unit 70 based on the image of the correction mark member 59 can be easily grasped at the position A or the position B provided in the vicinity of the side end 50a or 50b of the head unit 50 not directly influenced by the arrangement of the nozzles 5 when the board imaging unit 70 is moved to the vicinity of the side end 50a or 50b of the head unit 50.

According to the first embodiment, the correction mark members 59 are provided in the vicinity of the side end 50a (the X1 side) and the vicinity of the side end 50b (the X2 side) of the head unit 50 along a moving direction of the board imaging unit 70 relative to the head unit 50. Furthermore, the component mounting apparatus 100 is configured to correct the displacement of the board imaging unit 70 on the basis of the image of the corresponding correction mark member 59 imaged by the board imaging unit 70 in the vicinity of the side end 50a (the X1 side) or the vicinity of the side end 50b (the X2 side) when the board imaging unit 70 is moved relative to the head unit 50 to the vicinity of the side end 50a (the X1 side) or the vicinity of the side end 50b (the X2 side) of the head unit 50. Thus, the displacement of the board imaging unit 70 can be easily grasped at the position A (the position B) provided at the position corresponding to the vicinity of each side end when the board imaging unit 70 is moved to the position corresponding to the vicinity of the side end 50a or the vicinity of the side end 50b of the head unit 50, and hence an operation of recognizing the board 1 can be efficiently performed even in the case where the board 1 (the board recognition mark 3) is imaged at a plurality of positions.

According to the first embodiment, the component mounting apparatus 100 includes the supporting member 57 fixedly mounted in the vicinity of the position A (the position B) where the board imaging unit 70 can image the board 1 in the head unit 50. Furthermore, the correction mark member 59 is provided in the supporting member 57. Thus, as to a relative positional relation between the correction mark member 59 and the head unit 50, the correction mark member 59 and the head unit 50 are integrated through the supporting member 57 fixedly mounted on the head unit 50, and hence the amount of displacement of the board imaging unit 70 relative to the head unit 50 grasped on the basis of the image of the correction mark member 59 imaged by the board imaging unit 70 can be accurately grasped. Furthermore, the correction mark member 59 is provided in the head unit 50 by using the supporting member 57, whereby an optical system around the board imaging unit 70 can be easily configured.

Second Embodiment

A second embodiment is now described with reference to FIGS. 3, 4, and 8 to 10. In this second embodiment, a component mounting apparatus is configured to image a pair of correction mark members 202 and a board 1 (a board recognition mark 3) at once with a camera portion 73, unlike in the aforementioned first embodiment. The correction mark members 202 are examples of the "imaging position correction mark" in the present invention. In the drawings, portions identical to those of the aforementioned first embodiment are shown by the same reference numerals.

In the component mounting apparatus according to the second embodiment of the present invention, a board imaging unit 270 is mounted to be movable relative to a head unit 250 in a direction X, as shown in FIG. 8. The head unit 250 is an example of the "head portion" in the present invention, and the board imaging unit 270 is an example of the "board imaging portion" in the present invention.

In the board imaging unit 270, no lighting portion 74 (see FIG. 4) in the first embodiment is mounted on the edge of an opening 72c whereas a lighting portion 201 including LEDs is arranged between the rear surface of a mirror member 75 and a tubular portion 72a. Furthermore, only the pair of correction mark members 202 are mounted on a concave portion 57a of each of supporting members 57 provided on the head unit 250.

Figure 9:
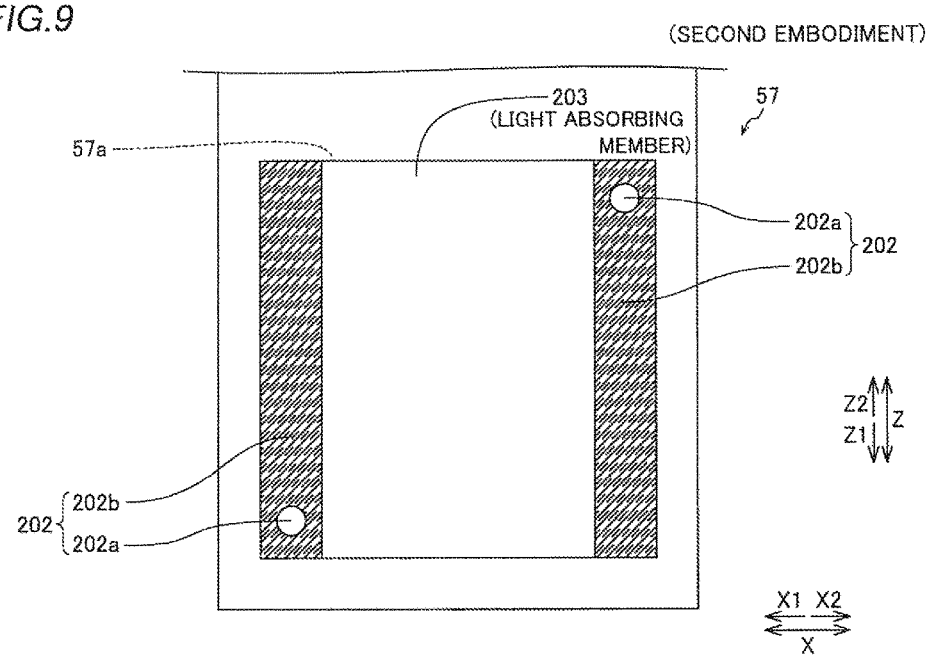
FIG. 9 illustrates the detailed structure of a correction mark member mounted on the head unit in the component mounting apparatus according to the second embodiment of the present invention.

The correction mark members 202 made of glass plates each are formed in a strip shape extending vertically, as shown in FIG. 9. The correction mark members 202 each have a substantially circular reflective portion 202a onto which a material capable of reflecting light is applied (evaporated) in the vicinity of one end in a longitudinal direction (a vertical direction) and a light shielding portion 202b onto which a black coating material is applied (evaporated) to cover a region other than the reflective portion 202a. The correction mark members 202 are fixed with an adhesive along end regions of the concave portion 57a of each of the supporting members 57 in the direction X. A correction mark member 202 on an X1 side and a correction mark member 202 on an X2 side are fixed upside down (in a direction Z) to the concave portion 57a. In addition, a light absorbing member 203 absorbing light such as an antireflective sheet is bonded to a substantially rectangular central region of the concave portion 57a on which no correction mark member 202 is mounted.

Thus, according to the second embodiment, operation processing for reflecting the displacement of the board imaging unit 270 (the optical axis of the camera portion 73) from a board recognition position (a position A) in an image of the board 1 is performed in the following manner.

Figure 10:
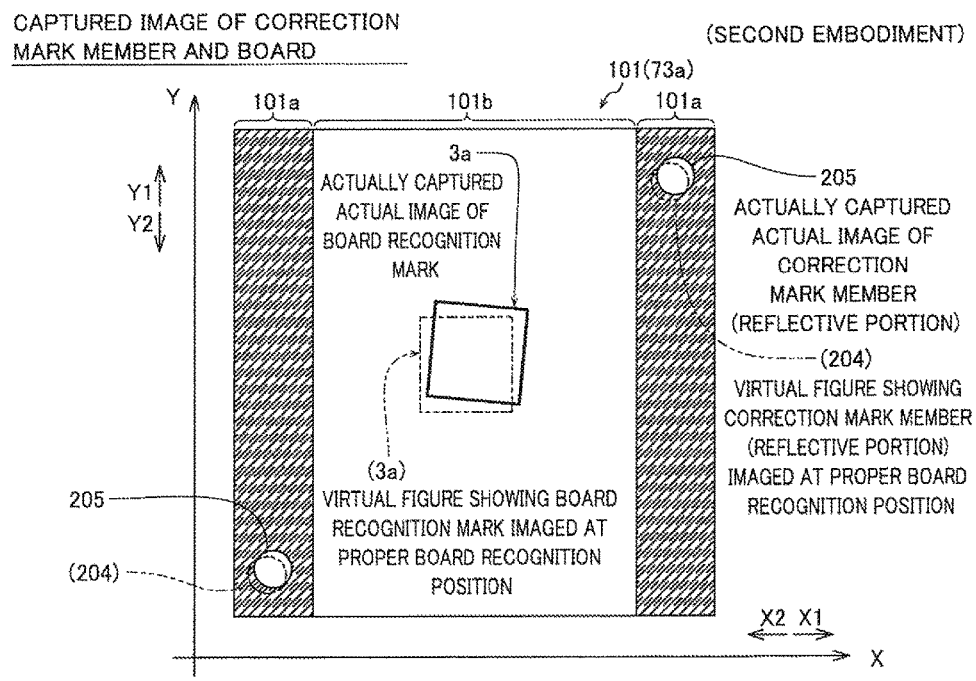
FIG. 10 illustrates that the displacement of the board imaging unit is corrected on the basis of an image of the correction mark member imaged by the board imaging unit in the component mounting apparatus according to the second embodiment of the present invention.

Specifically, when the lighting portion 201 is turned on, the camera portion 73 images the board recognition mark 3 of the board 1 at the same time that the camera portion 73 images the correction mark members 202, as shown in FIG. 8. In other words, light of the lighting portion 201 is directed downward by a reflective surface 75a of the mirror member 75 to light a mounting surface 1a of the board 1 at the same time that the light of the lighting portion 201 is transmitted forward through the reflective surface 75a of the mirror member 75 to light the correction mark members 202. Therefore, light reflected by (two) reflective portions 202a of the pair of correction mark members 202 is imaged as actual images 205 in regions 101a arranged on ends (both sides) of a viewing region 101 of the camera portion 73, as shown in FIG. 10. The regions 101a are arranged outside a central portion of the viewing region 101. At the same time, light reflected by the board recognition mark 3 of the board 1 is imaged as an actual image 3a in a region 101b arranged in the central portion of the viewing region 101. The regions 101a and 101b are examples of the "first region" and the "second region" in the present invention, respectively.

According to the second embodiment, a main control portion 81 (see FIG. 3) is configured to calculate the "amounts of geometric displacement" of the actual images 205 from virtual figures 204 based on the captured actual images 205 on the basis of image processing performed by an image processing portion 85 (see FIG. 3). Thus, these amounts of displacement are grasped on the basis of the image processing performed by the image processing portion 85, whereby the amount of displacement of the board imaging unit 270 from the proper board recognition position (the position A) is grasped by a controller 80 (see FIG. 3). Although the reflective portions 202a each have a substantially circular shape, the two reflective portions 202a arranged at different positions (right and left regions) in the single viewing region 101 are imaged as the actual images 205 so that in addition to the amounts of displacement of the board imaging unit 270 in the direction X and a direction Y with respect to the head unit 250, the amount of rotational displacement of the board imaging unit 270 about a Z-axis in a direction R in an X-Y plane can be easily calculated from the geometric displacement of the two actual images 205 with respect to the virtual figures 204.

Therefore, even in the case where the board imaging unit 270 is moved to a position displaced by a prescribed amount from the position A and images the board 1 at this position, the image of the board 1 is acquired as image data (positional information of the board recognition mark 3) in which the amount of displacement of the board imaging unit 270 from the proper position A is reflected. Thus, the image of the board 1 (the board recognition mark 3) is corrected by the amount of displacement, so that the image of the board 1 substantially identical to that in the case of imaging the board recognition mark 3 at the proper position A (the board recognition position) for imaging the board 1 without displacement of the board imaging unit 270 is obtained on control data. The remaining structure of the head unit 250 (see FIG. 8) according to the second embodiment is similar to that of the head unit 50 according to the aforementioned first embodiment.

According to the second embodiment, as hereinabove described, the (two) regions 101a where the pair of correction mark members 202 are imaged and the region 101b where the board recognition mark 3 of the board 1 is imaged are provided in the viewing region 101 of the camera portion 73 of the board imaging unit 270. Furthermore, the component mounting apparatus is configured to correct the displacement of the board imaging unit 270 from the board recognition position (the position A) on the basis of images (the actual images 205) of the reflective portions 202a imaged in the regions 101a of the camera portion 73 through an optical path L1 and image the board recognition mark 3 of the board 1 in the region 101a of the camera portion 73 through an optical path L2, when the board imaging unit 270 is moved relative to the head unit 250 to the board recognition position (the position A). Thus, effectively using the single viewing region 101 of an imaging element 73a of the camera portion 73, the board imaging unit 270 (the camera portion 73) can image the correction mark members 202 in the regions 101a of the viewing region 101 and image the board recognition mark 3 of the board 1 in the region 101b of the viewing region 101 at once. Thus, a board recognition operation including an operation of correcting the displacement of the board imaging unit 270 relative to the head unit 250 can be performed more quickly.

According to the second embodiment, the region 101b is arranged in the central portion of the viewing region 101 of the board imaging unit 270, and the regions 101a are arranged in outer regions of the viewing region 101 of the board imaging unit 270 outside the central portion. Furthermore, the component mounting apparatus is configured to correct the displacement of the board imaging unit 270 from the board recognition position (the position A) on the basis of the images of the correction mark members 202 imaged in the outer regions of the viewing region 101 of the board imaging unit 270 through the optical path L1 and image the board 1 in the central portion of the viewing region 101 of the board imaging unit 270 through the optical path L2, when the board imaging unit 270 is moved relative to the head unit 250 to the board recognition position (the position A). Thus, the correction mark members 202 can be imaged, effectively using the outer regions of the viewing region 101 outside the central portion while the board 1 is imaged in the central portion of the viewing region 101 closer to the optical axis of the board imaging unit 270.

According to the second embodiment, the regions 101a are arranged on both sides (the X1 side and the X2 side) of the region 101b along a moving direction of the board imaging unit 270 relative to the head unit 250. Furthermore, the correction mark members 202 are provided in the head unit 250 to be imaged in the regions 101a arranged on both sides of the region 101b. Thus, the amount of displacement of the board imaging unit 270 including rotational components relative to the head unit 250 in the plane of the mounting surface 1a can be easily and accurately acquired on the basis of the images of the correction mark members 202 imaged in the two regions 101a arranged on both sides of the region 101b. The remaining effects of the second embodiment are similar to those of the aforementioned first embodiment.

Third Embodiment

A third embodiment is now described with reference to FIGS. 3 and 11 to 13. In this third embodiment, camera portions 73 of board imaging units 370 are provided in a head unit 350 to be movable vertically (in a direction Z) in case bodies 72, unlike in the aforementioned first embodiment. The head unit 350 is an example of the "head portion" in the present invention, and the camera portions 73 are examples of the "board imaging portion" in the present invention. In the drawings, portions identical to those of the aforementioned first embodiment are shown by the same reference numerals in the drawings.

Figure 11:
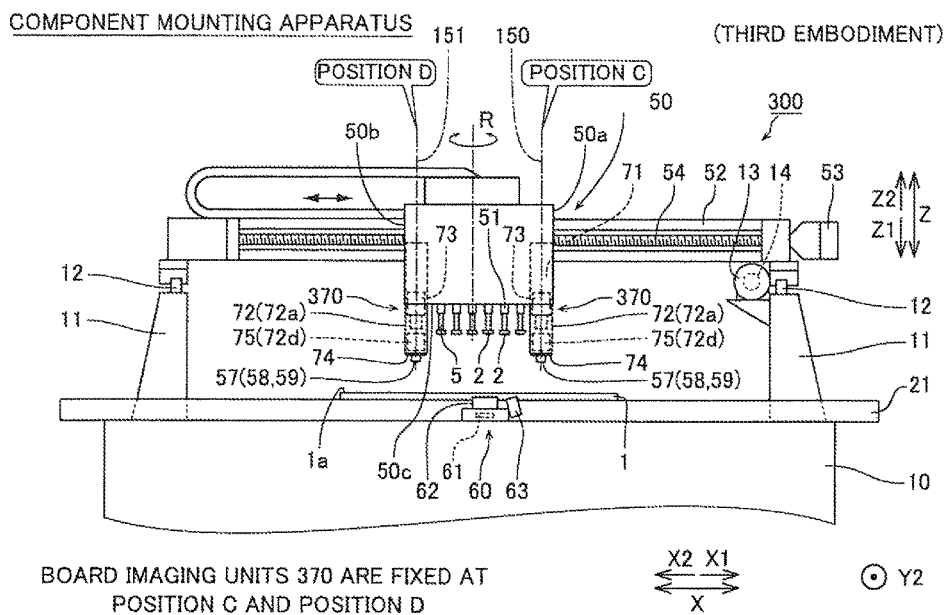
FIG. 11 is a front elevational view showing the overall structure of a component mounting apparatus according to a third embodiment of the present invention.

In a component mounting apparatus 300 according to the third embodiment of the present invention, the respective board imaging units 370 are provided at a position C (an X1 side) and a position D (an X2 side) in the head unit 350, as shown in FIG. 11. The board imaging units 370 are fixed at the position C and the position D without horizontal movement along arrow X1 or X2.

Figure 12:
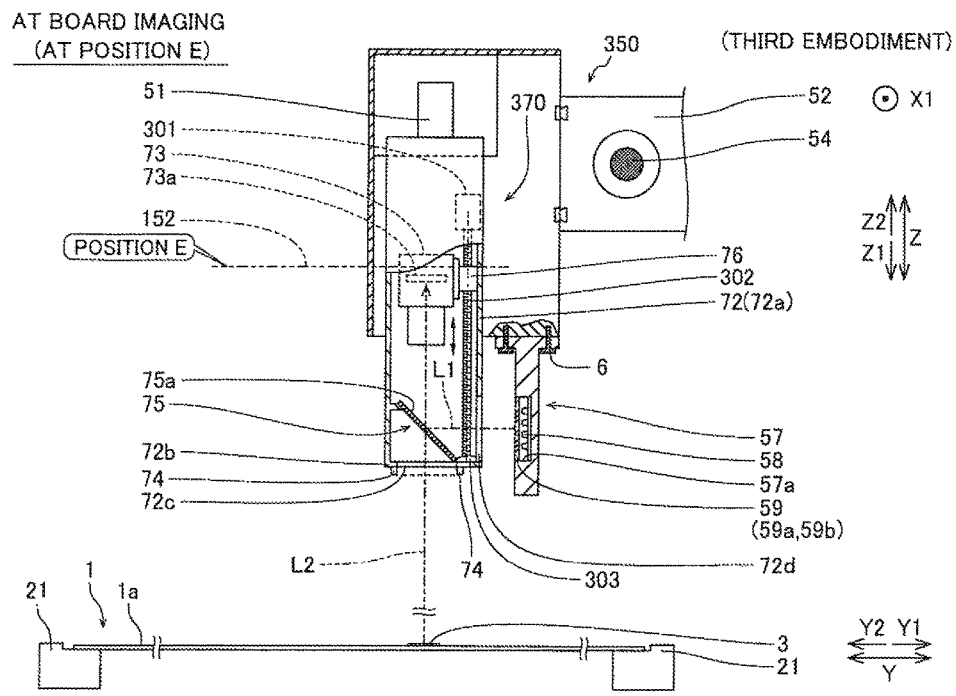
FIG. 12 is a side elevational view showing a state where a camera portion is vertically moved to the vicinity of a board recognition position in a head unit in the component mounting apparatus according to the third embodiment of the present invention.

According to the third embodiment, each of the board imaging units 370 is provided with a Z-axis servomotor 301, a ball screw shaft 302, and a shaft bearing 303, as shown in FIG. 12. The Z-axis servomotor 301 is fixed obliquely above a camera portion 73 of a case body 72, and the ball screw shaft 302 extending vertically (in the direction Z) is rotatably mounted on the Z-axis servomotor 301 on the rear side (the Y1 side) of the camera portion 73. A lower end of the ball screw shaft 302 is rotatably supported by the shaft rearing 303 provided on a lower end 72b of a tubular portion 72a. The camera portion 73 is provided with a nut member 76 meshing with the ball screw shaft 302, and the Z-axis servomotor 301 rotates the ball screw shaft 302, whereby along with the nut member 76, the camera portion 73 is vertically moved along arrow Z1 or Z2 in the case body 72.

According to the third embodiment, supporting members 57 are fixed to the head unit 350 with screw members 6 on the rear side (the Y1 side) of the board imaging units 370 fixed at the position C and the position D. Furthermore, a correction mark member 59 and a lighting portion 58 are mounted in this order on each of the supporting members 57 to be directed to a board imaging unit 370 (a Y2 side). A rectangular opening 72d is formed in the rear wall surface (on the Y1 side) of the tubular portion 72a of the case body 72, and the camera portion 73 can receive light (an optical path L1) from the lighting portion 58 through the opening 72d and a mirror member 75 (a reflective surface 75a). In FIG. 12, the ball screw shaft 302 crosses the optical path L1 vertically for convenience of illustration, but actually, the ball screw shaft 302 is arranged at a position not overlapping with the optical path L1 connecting the correction mark member 59 and the mirror member 75 in a direction Y (a position deviating from the optical path L1 to the X1 side or the X2 side (see FIG. 11)).

The focal length of the camera portion 73 is a fixed value (a constant value). Therefore, in each of the board imaging units 370, the focal length of the camera portion 73 to a mounting surface 1a of a board 1 is finely adjusted according to the specifications (the thickness, etc.) of the board 1 by driving an elevating mechanism portion described above to elevate the camera portion 73 vertically in order to more clearly (accurately) image the outline (outer shape) of a board recognition mark 3 of the board 1. Thus, when the board recognition mark 3 of the board 1 is imaged with each of the board imaging units 370, the camera portion 73 is vertically moved to a position obtained by accurately adjusting the focal length in the direction Z for each board 1 and thereafter images the board recognition mark 3.

At this time, according to the third embodiment, an image (image data) of the board 1 can be obtained in a state where the displacement of the camera portion 73 from the proper board recognition position (the position E) in the head unit 350 is corrected (reflected) when the camera portion 73 is vertically moved to the vicinity of a position E (the height position of a horizontal line 152) as a board recognition position in the direction Z in the head unit 350, as shown in FIG. 12. In other words, when the camera portion 73 is moved to the vicinity of the position E, the displacement of the camera portion 73 relative to the head unit 350 in the direction Z (the amount of displacement of an imaging element 73a of the camera portion 73 from the position E) grasped on the basis of an image of the correction mark member 59 imaged by the board imaging unit 370 is grasped by a controller 80 (see FIG. 3), and arithmetic processing for reflecting the amount of displacement grasped by the controller 80 in the image of the board 1 is performed. Thus, even in the case where the camera portion 73 images the board 1 in a state displaced by a prescribed amount from the position E in the direction Z, the image of the board 1 is acquired after the same is replaced by image data (positional information of the board recognition mark 3) in which the amount of displacement of the camera portion 73 from the proper position E is reflected. The position E is an example of the "board recognition position" in the present invention.

Figure 13:
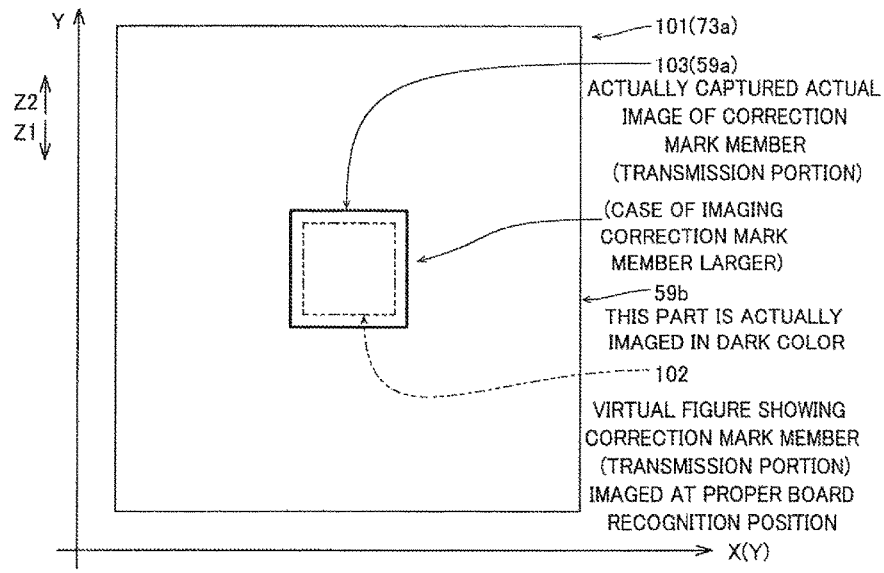
FIG. 13 illustrates that the displacement of the camera portion is corrected on the basis of an image of a correction mark member imaged by a board imaging unit in the component mounting apparatus according to the third embodiment of the present invention.

First, the "amount of displacement" of the camera portion 73 relative to the head unit 350 in the direction Z is calculated through the same image processing as in the aforementioned first embodiment. At this time, an actual image 103 of the correction mark member 59 in the case of imaging the board recognition mark 3 in a state where the camera portion 73 is displaced from a position (the proper position E) where the focal length to the board 1 is appropriate is different in size (outer shape) from a virtual figure 102 of the correction mark member 59 in the case of imaging the board recognition mark 3 in a state where the camera portion 73 is moved to the position (the proper position E) where the focal length to the board 1 is appropriate, as shown in FIG. 13. According to the third embodiment, a numerical difference in size (outer shape) between the actual image 103 (shown by a bold solid line) and the virtual figure 102 (shown by a two-dot chain line) is grasped through the image processing, whereby the enlargement ratio (the reduction ratio) of the actual image 103 to the virtual figure 102 is calculated as the "amount of displacement". FIG. 13 slightly exaggeratingly shows a state where the camera portion 73 comes closer to the board 1 beyond the proper position E (the position where the focal length is appropriate) and images the correction mark member 59 (a transmission portion 59a) slightly larger than the original size (the virtual figure 102).

According to the third embodiment, a correction coefficient previously set according to the "amount of displacement" based on the calculated enlargement ratio or reduction ratio is reflected in adjustment of an image scaling factor (a magnification) that the camera portion 73 has. In other words, when the actual image 103 is captured larger than the virtual figure 102, as shown in FIG. 13, a correction coefficient corresponding to a reduction ratio for reducing the size of the actual image 103 to the size of the virtual figure 102 is applied to adjustment of the image scaling factor of the camera portion 73. On the other hand, when the actual image 103 is captured smaller than the virtual figure 102 (when the camera portion 73 is spaced farther from the board 1 than the proper position E (the position where the focal length is appropriate)), a correction coefficient corresponding to an enlargement ratio for enlarging the size of the actual image 103 to the size of the virtual figure 102 is applied to adjustment of the image scaling factor of the camera portion 73.

Therefore, although the camera portion 73 images the board recognition mark 3 in a state displaced from the proper board recognition position (the position E), correction processing directed to the actual dimension of the board recognition mark 3 is performed on the actual image data of the board recognition mark 3 on the basis of the image scaling factor of the camera portion 73 in which the aforementioned correction coefficient corresponding to the enlargement ratio or reduction ratio has been taken into consideration. In this manner, the positional information of the board recognition mark 3 having image data in which the vertical displacement has been corrected is acquired. The remaining structure of the head unit 350 according to the third embodiment is similar to that of the head unit 50 according to the aforementioned first embodiment.

According to the third embodiment, as hereinabove described, the board imaging unit 370 having the camera portion 73 moved in a direction (the direction Z) perpendicular to the mounting surface 1a of the board 1 is configured to image the board recognition mark 3 of the board 1, taking the amount of displacement of the camera portion 73 from the board recognition position (the position E) along a vertical direction (the direction Z) into consideration. Thus, even in the case where the camera portion 73 having a fixed focal length is vertically moved to image the board recognition mark 3 corresponding to the individual board 1, in the image of the board 1 (the board recognition mark 3), the displacement of the camera portion 73 in vertical movement (a deviation in the focal length of the camera portion 73 to the board 1 (the mounting surface 1a)) is corrected, and hence an image substantially identical to an image of the board 1 imaged by the camera portion 73 at the proper position E (see FIG. 11) for imaging the board 1 can be obtained. Consequently, the accuracy of recognition of the board 1 in the board imaging unit 370 can be further improved.

According to the third embodiment, the image of the board 1 in which the displacement has been corrected is acquired by reflecting the displacement of the board imaging unit 370 relative to the head unit 350 in the direction substantially perpendicular to the mounting surface 1a of the board 1 in the image data of the board 1 imaged by the board imaging unit 370. Thus, when the board imaging unit 370 is configured to be moved relative to the head unit 350 in the direction substantially perpendicular to the mounting surface 1a of the board 1 so as to recognize the board 1, correction data of the displacement of the board imaging unit 370 relative to the head unit 350 in the direction substantially perpendicular to the mounting surface 1a can be properly reflected in the captured image data of the board 1, and the image (the corrected captured image data) of the board 1 can be easily acquired.

According to the third embodiment, the board imaging unit 370 includes the camera portion 73 for recognizing the board 1. Furthermore, the camera portion 73 is configured to be movable to the board recognition position (the position E) where the board 1 can be imaged along the direction substantially perpendicular to the mounting surface 1a of the board 1 in the head unit 350, and the component mounting apparatus 300 is configured to acquire the image of the board 1 in which the displacement has been corrected in a state where the magnification of the camera portion 73 (an image scaling factor) is adjusted on the basis of the image of the correction mark member 59 imaged by the camera portion 73 when the camera portion 73 is moved relative to the head unit 350 to the board recognition position (the position E). Thus, even in the case where the camera portion 73 images the board 1 in a state where the camera portion 73 is moved to a position slightly closer to or slightly farther from the mounting surface 1a of the board 1 beyond the proper board recognition position (the position E), the magnification of the camera portion 73 is adjusted on the basis of the image of the correction mark member 59 imaged by the camera portion 73, and hence the image of the board 1 corrected in accordance with the actual dimension (the corrected captured image data) can be acquired. Particularly when the camera portion 73 having a fixed focal length is employed, this structure is useful since the image of the board 1 in accordance with the actual dimension can be acquired regardless of the displacement of the camera portion 73. The remaining effects of the third embodiment are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the displacement of the board imaging unit 70 (270) from the board recognition position generated when the board imaging unit 70 (270) is moved relative to the head unit 50 (250) in the direction X is corrected in each of the aforementioned first and second embodiments, the present invention is not restricted to this. For example, the displacement of the board imaging unit from the board recognition position generated when the board imaging unit is moved in the direction Y relative to a head unit extending in the direction Y may alternatively be corrected. Furthermore, the present invention may be applied to a board imaging portion provided in the head unit 50 to be movable relative to the head unit 50 in both the direction X and the direction Y. Thus, the exact position of the board 1 in the X-Y plane (in the horizontal plane) can be grasped with a high degree of accuracy even in the case where the board imaging unit 70 is configured to be moved relative to the head unit 50 in the direction along the mounting surface 1a of the board 1 so as to recognize the board 1.

While the board imaging unit 70 (270) is movable only along the mounting surface 1a of the board 1 in each of the aforementioned first and second embodiments, the camera portions 73 are movable only along the direction (the direction Z) perpendicular to the mounting surface 1a of the board 1 in the aforementioned third embodiment, and the displacement of the camera portion(s) 73 relative to the head unit 50 (250, 350) is corrected on the basis of the images of the correction mark members 59 imaged by the camera portion(s) 73 in the structure of each of the first to third embodiments, the present invention is not restricted to this. For example, the aforementioned first to third embodiments may be combined to configure a component mounting apparatus as in a modification shown in FIG. 14. In the drawing, portions identical to those of the aforementioned first to third embodiments are shown by the same reference numerals.

Figure 14:
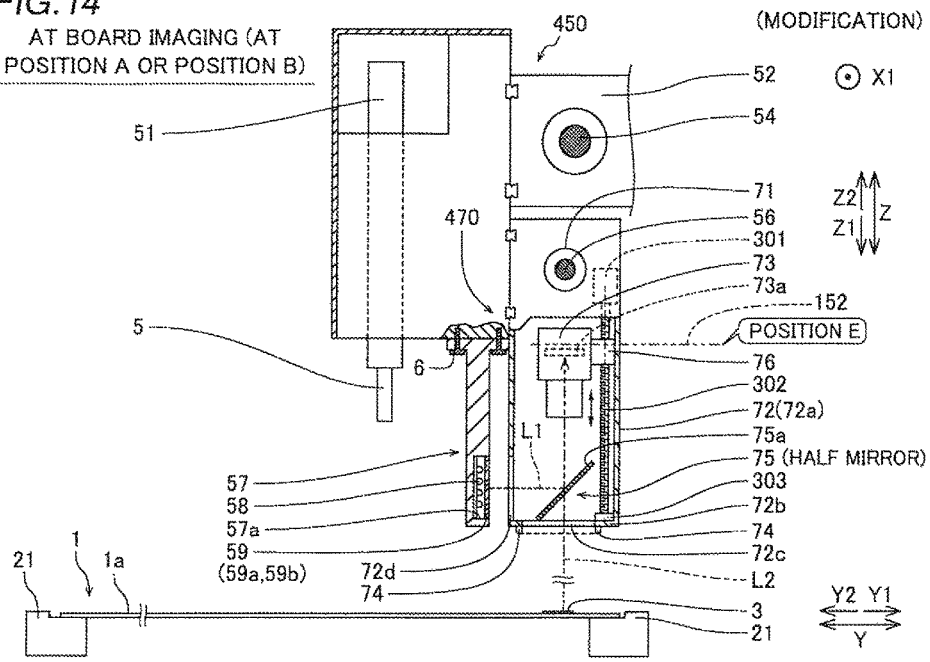
FIG. 14 is a side elevational view showing a structure around a head unit in a component mounting apparatus according to a modification of the present invention.

Specifically, the present invention is applicable to the structure of not only moving a single board imaging unit 470 in a direction (a direction vertical to the plane of the figure) horizontal to a head unit 450 but also moving a camera portion 73 in the board imaging unit 470 in a vertical direction (a direction Z), as shown in FIG. 14. In other words, the displacement of the board imaging unit 470 relative to the head unit 450 in a direction X substantially parallel to a board 1 (a mounting surface 1a) is corrected on the basis of an image of a correction mark member 59 imaged when the board imaging unit 470 is moved to a position A or a position B (see FIG. 2). In addition, the displacement of the camera portion 73 in the board imaging unit 470 relative to the head unit 450 (a board recognition position (a position E)) in the direction Z substantially perpendicular to the board 1 (the mounting surface 1a) is corrected in a state where the board imaging unit 470 is moved to the position A or the position B. The head unit 450 and the board imaging unit 470 are examples of the "head portion" and the "board imaging portion" in the present invention, respectively. According to this structure in the modification, the position of the board 1 in an X-Y plane (in a horizontal plane) can be grasped with a high degree of accuracy when the board imaging unit 470 is moved along the mounting surface 1a, and an image of the board recognition mark 3 in which a deviation in the focal length of the camera portion 73 to the mounting surface 1a has been corrected can be easily obtained even in the case of employing the camera portion 73 having a fixed focal length, and hence a component mounting apparatus of high value can be provided.

While the camera portion(s) 73 is fixed in the case body(ies) 72 in the state where the lens portion(s) thereof is directed downward in each of the aforementioned first to third embodiments, the present invention is not restricted to this. The board imaging unit(s) 70 (270, 370) may alternatively be so configured that the camera portion(s) 73 thereof is directed in a direction other than the downward direction. In this case, the shape of the case body(s) 72 or the arrangement of the "optical member" according to the present invention such as the mirror member(s) 75 in the case body(ies) 72 is varied properly, whereby the optical paths L1 for imaging the correction mark members 59 (202) and the optical paths L2 for imaging the board 1 can be formed to image the correction mark members 59 (202) and the board 1 with the camera portion(s) 73.

While the supporting members 57 mounted with the correction mark members 59 (202) are mounted on the lower surface 50c of the head unit 50 (250, 350) with the screw members 6 in each of the aforementioned first to third embodiments, the present invention is not restricted to this. For example, the correction mark members 59 may alternatively be provided in supporting portions integrally formed in the head unit 50.

While the correction mark members 59 (202) made of the glass plates are employed as the "imaging position correction mark" according to the present invention in each of the aforementioned first to third embodiments, the present invention is not restricted to this. In other words, the "imaging position correction mark" according to the present invention may be directly mounted on the head unit 50 so far as the board imaging unit 70 can image the correction mark members and the displacement of the board imaging unit 70 relative to the head unit 50 can be grasped.

While the correction mark members 202 are provided on both ends of each of the concave portions 57a of the supporting members 57 in the direction X in the aforementioned second embodiment, the present invention is not restricted to this. A single correction mark member 202 may alternatively be provided on either end of the concave portion 57a in the direction X. In this case, a reflective portion 202a is preferably configured to have a rectangular shape or a polygonal shape as in the aforementioned first embodiment. Thus, the amount of rotational displacement of the board imaging unit 270 can be grasped with the single reflective portion 202a (the imaging position correction mark), similarly to the aforementioned first embodiment.

While the correction mark members 59 are mounted on the supporting members 57 of the head unit 350 in the aforementioned third embodiment, the present invention is not restricted to this. For example, the correction mark members 59 may alternatively be mounted on the case bodies 72 of the board imaging units 370. Thus, the displacement of the camera portions 73 from the board recognition position (the position E) can be grasped.

While the Z-axis servomotor 301 and the ball screw shaft 302 for elevating the camera portion 73 are arranged on the rear side (the Y1 side) of the camera portion 73 in the aforementioned third embodiment, the present invention is not restricted to this. The Z-axis servomotor 301 and the ball screw shaft 302 may alternatively be provided on either a right (X1-side) or a left (X2-side) wall portion of the tubular portion 72a of the case body 72.

While the board imaging unit(s) 70 (270, 370) is moved relative to the head unit 50 (250, 350) having the six mounting heads 51 arranged in a line along the direction X in each of the aforementioned first to third embodiments, the present invention is not restricted to this. The "board imaging portion" according to the present invention may alternatively be incorporated in a head portion having two or three lines of nozzles disposed in a tandem arrangement or a rotary head portion having a plurality of annularly arranged mounting heads.

What is claimed is:

1. A component mounting apparatus comprising:
a head portion capable of mounting a component suctioned by a nozzle on a board;
a board imaging portion imaging the board from above and being provided on the head portion, the board imaging portion being configured to move with respect to the head portion; and
an imaging position correction mark member provided fixedly in the head portion, the imaging position correction mark member being configured to be imaged by the board imaging portion, wherein
the component mounting apparatus is configured to correct a displacement of the board imaging portion with respect to the head portion in an image of the board imaged by the board imaging portion on the basis of an image of the imaging position correction mark member imaged by the board imaging portion, thereby correcting the image of the board imaged by the board imaging portion by reflecting the displacement of the board imaging portion with respect to the head portion to the image of the board imaged by the board imaging portion, and recognizing the board on the basis of the corrected image of the board, wherein the imaging position correction mark member is provided at a board recognition position where the board imaging portion can image the board in the head portion, the board recognition position is provided in an end of the head portion, the board imaging portion includes an optical member capable of reflecting and transmitting light and forming a first optical path and a second optical path, and the board imaging portion is configured to image the imaging position correction mark member through the first optical path formed by the optical member and image the board through the second optical path formed by the optical member at the board recognition position.

2. The component mounting apparatus according to claim 1, wherein the board imaging portion is configured to be movable to the board recognition position where the board can be imaged in the head portion, the component mounting apparatus configured to correct a displacement of the board imaging portion from the board recognition position in the head portion on the basis of the image of the imaging position correction mark member imaged by the board imaging portion.

3. The component mounting apparatus according to claim 1, wherein the image of the imaging position correction mark member imaged by the board imaging portion includes displacement information grasped in a case where the board imaging portion images the imaging position correction mark member with a displacement with respect to the head portion, based on a case where the board imaging portion images the imaging position correction mark member without the displacement with respect to the head portion, the component mounting apparatus configured to acquire an image of the board in which the displacement of the board imaging portion with respect to the head portion has been corrected by reflecting a displacement of the board imaging portion with respect to the head portion based on the displacement information in image data of the board imaged by the board imaging portion.

4. The component mounting apparatus according to claim 1, wherein the board imaging portion is configured to be movable with respect to the head portion along a direction substantially parallel to a mounting surface of the board on which the component is mounted, the component mounting apparatus configured to correct a displacement of the board imaging portion with respect to the head portion in the direction substantially parallel to the mounting surface of the board on the basis of the image of the imaging position correction mark member imaged by the board imaging portion.

5. The component mounting apparatus according to claim 4, configured to acquire an image of the board in which the displacement has been corrected by reflecting the displacement of the board imaging portion with respect to the head portion in the direction substantially parallel to the mounting surface of the board in image data of the board imaged by the board imaging portion.

6. The component mounting apparatus according to claim 4, wherein the imaging position correction mark member includes a mark having corners, the component mounting apparatus configured to correct the displacement of the board imaging portion with respect to the head portion in the direction substantially parallel to the mounting surface of the board on the basis of an image of the mark having corners imaged by the board imaging portion.

7. The component mounting apparatus according to claim 1, wherein the board imaging portion is configured to be movable with respect to the head portion along a direction substantially perpendicular to a mounting surface of the board on which the component is mounted, the component mounting apparatus configured to correct a displacement of the board imaging portion with respect to the head portion in the direction substantially perpendicular to the mounting surface of the board on the basis of the image of the imaging position correction mark member imaged by the board imaging portion.

8. The component mounting apparatus according to claim 7, configured to acquire an image of the board in which the displacement has been corrected by reflecting the displacement of the board imaging portion with respect to the head portion in the direction substantially perpendicular to the mounting surface of the board in image data of the board imaged by the board imaging portion.

9. The component mounting apparatus according to claim 7, wherein the board imaging portion further includes a camera portion for board recognition, and the camera portion is configured to be movable to a board recognition position where the board can be imaged along the direction substantially perpendicular to the mounting surface of the board in the head portion, the component mounting apparatus configured to acquire an image of the board in which the displacement has been corrected in a state where a magnification of the camera portion is adjusted on the basis of an image of the imaging position correction mark member imaged by the camera portion when the camera portion is moved with respect to the head portion to the board recognition position.

10. The component mounting apparatus according to claim 1, wherein the component mounting apparatus configured to correct a displacement of the board imaging portion from the board recognition position in the head portion on the basis of the image of the imaging position correction mark member imaged by the board imaging portion when the board imaging portion is moved with respect to the head portion to the board recognition position.

11. The component mounting apparatus according to claim 1, wherein the component mounting apparatus configured to correct a displacement of the board imaging portion from the board recognition position on the basis of an image of the imaging position correction mark member imaged in a viewing region of the board imaging portion through the first optical path formed by the optical member and image the board in the viewing region of the board imaging portion through the second optical path formed by the optical member, when the board imaging portion is moved with respect to the head portion to the board recognition position.

12. The component mounting apparatus according to claim 11, wherein the imaging position correction mark member is so provided in the head portion that a length of the first optical path used to image the imaging position correction mark member with the board imaging portion becomes substantially equal to a length of the second optical path used to image the board with the board imaging portion.

13. The component mounting apparatus according to claim 11, wherein
the first optical path comprises an optical path formed to capture an image of the imaging position correction mark member reflected by the optical member with the board imaging portion, and
the second optical path comprises an optical path formed to capture an image of the board transmitted through the optical member with the board imaging portion.

14. The component mounting apparatus according to claim 1, wherein
a viewing region of the board imaging portion includes a first region where the imaging position correction mark member is imaged and a second region where the board is imaged, provided in a region different from the first region, and
the component mounting apparatus configured to correct a displacement of the board imaging portion from the board recognition position on the basis of an image of the imaging position correction mark member imaged in the first region of the board imaging portion through the first optical path formed by the optical member and image the board in the second region of the board imaging portion through the second optical path formed by the optical member, when the board imaging portion is moved with respect to the head portion to the board recognition position.

15. The component mounting apparatus according to claim 14, wherein
the second region is arranged in a central portion of the viewing region of the board imaging portion, and the first region is arranged in an outer region of the viewing region of the board imaging portion outside the central portion,
the component mounting apparatus configured to correct the displacement of the board imaging portion from the board recognition position on the basis of an image of the imaging position correction mark member imaged in the outer region of the viewing region of the board imaging portion through the first optical path and image the board in the central portion of the viewing region of the board imaging portion through the second optical path, when the board imaging portion is moved with respect to the head portion to the board recognition position.

16. The component mounting apparatus according to claim 15, wherein
the first region is arranged on each side of the second region along a moving direction of the board imaging portion with respect to the head portion, and
the imaging position correction mark member is provided in the head portion to be imaged in the first region arranged on each side of the second region.

17. The component mounting apparatus according to claim 1, configured to correct the displacement of the board imaging portion with respect to the head portion on the basis of the image of the imaging position correction mark member imaged by the board imaging portion when the board imaging portion is moved with respect to the head portion to an end of the head portion.

18. The component mounting apparatus according to claim 17, wherein
the board imaging portion is configured to be movable to the board recognition position where the board can be imaged in the head portion, and
the component mounting apparatus configured to correct a displacement of the board imaging portion from the board recognition position in the head portion on the basis of the image of the imaging position correction mark member imaged by the board imaging portion when the board imaging portion is moved with respect to the head portion to the end.

19. The component mounting apparatus according to claim 18, wherein
the imaging position correction mark member is provided at a position corresponding to each of a first end of the head portion and a second end of the head portion along a moving direction of the board imaging portion with respect to the head portion,
the component mounting apparatus configured to correct the displacement on the basis of an image of the corresponding imaging position correction mark member imaged by the board imaging portion in the first end or the second end when the board imaging portion is moved with respect to the head portion to the first end of the head portion or the second end of the head portion.

20. The component mounting apparatus according to claim 1, further comprising a supporting member fixedly mounted in the board recognition position where the board imaging portion can image the board in the head portion, wherein
the imaging position correction mark member is provided in the supporting member.

* * * * *